(12) United States Patent
He

(10) Patent No.: US 11,237,734 B2
(45) Date of Patent: Feb. 1, 2022

(54) HIGH THROUGHPUT DRAM WITH DISTRIBUTED COLUMN ACCESS

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 16/543,778

(22) Filed: Aug. 19, 2019

(65) Prior Publication Data

US 2021/0055867 A1    Feb. 25, 2021

(51) Int. Cl.
*G06F 3/06*       (2006.01)
*G06F 13/16*      (2006.01)

(52) U.S. Cl.
CPC .......... *G06F 3/0613* (2013.01); *G06F 3/0659* (2013.01); *G06F 3/0673* (2013.01); *G06F 13/1668* (2013.01)

(58) Field of Classification Search
CPC .... G06F 3/0613; G06F 3/0625; G06F 3/0659; G06F 3/0673; G06F 3/0635; G06F 3/0629; G06F 13/1668; G06F 12/02; G06F 12/0207; G06F 12/0607
See application file for complete search history.

(56) References Cited

U.S. PATENT DOCUMENTS

| | | | | |
|---|---|---|---|---|
| 10,019,173 | B1* | 7/2018 | Roh | G06F 3/0625 |
| 10,802,756 | B1* | 10/2020 | Pream | G06F 3/0604 |
| 2011/0296118 | A1* | 12/2011 | Carter | G06F 13/1678 |
| | | | | 711/154 |
| 2012/0198132 | A1* | 8/2012 | Han | G11C 11/5628 |
| | | | | 711/103 |
| 2017/0199703 | A1* | 7/2017 | Ravimohan | G06F 3/0659 |
| 2017/0357447 | A1* | 12/2017 | Jung | G06F 3/0659 |
| 2018/0285013 | A1* | 10/2018 | Rajan | G06F 3/0673 |
| 2019/0310798 | A1* | 10/2019 | Yoon | G06F 3/0659 |
| 2020/0326853 | A1* | 10/2020 | Lee | G06F 3/0653 |
| 2021/0042225 | A1* | 2/2021 | Lee | G06F 12/0804 |

* cited by examiner

*Primary Examiner* — Michael Krofcheck
(74) *Attorney, Agent, or Firm* — Perkins Coie LLP

(57) ABSTRACT

An apparatus having memory dies with a memory cell array divided into a plurality of data segments. A stagger circuit selects a common command signal and sets a column access signal to select a data segment to be accessed based on the common command signal and/or an individual command signal to perform a memory operation corresponding to the selected common command signal on the selected data segment. A data bus connects the memory cell arrays to form data units with each data unit including a data segment from each memory cell array and configured such that the data segments are connected in parallel to the data bus and use a same line of the data bus. The stagger circuits are configured such that data segments identified for activation in the plurality of memory dies are not part of a same data unit.

23 Claims, 13 Drawing Sheets

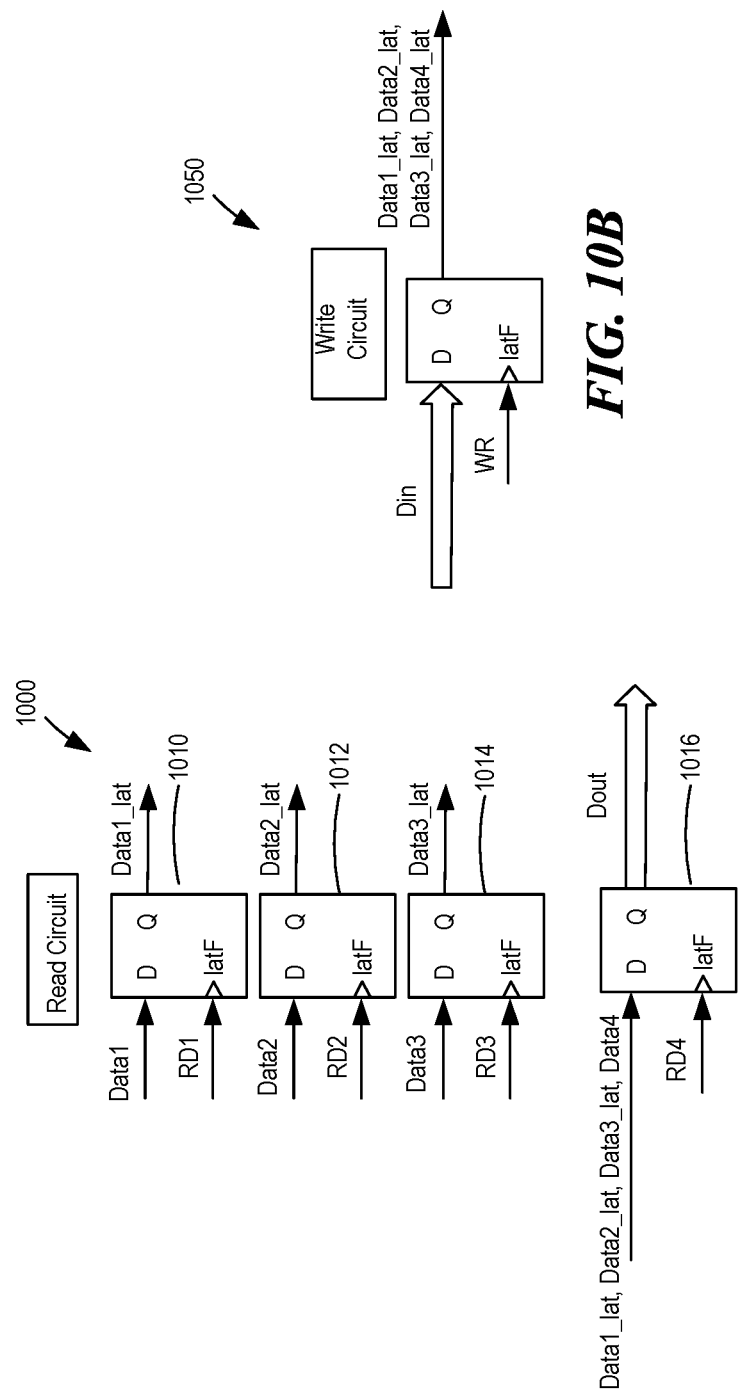

HIGH THROUGHPUT DRAM WITH DISTRIBUTED COLUMN ACCESS

TECHNICAL FIELD

The present disclosure is directed to systems for column access in dynamic random-access memory, and more particularity to high throughput data transfer by distributing the column access selection over a command signal period.

BACKGROUND

Devices that fall under the category of "internet-of-things" (IoT) can include data collection devices such as, for example, temperature sensors, tracking sensors (e.g., for tracking pets, automobiles, etc., using, e.g., GPS sensors), metering sensors (water, gas, etc.), environmental monitoring sensors (e.g., gas, fire, smoke, carbon monoxide, etc.), devices to monitor remote machines (vending machines, industrial equipment, etc.), proximity sensors, etc. One or more IoT sensors can be connected (e.g., wirelessly and/or wired) to one or more IoT nodes, which can be cloud or Internet connected. An IoT node can include a processor for writing received sensor data to a memory device and for reading the stored sensor data from the memory device in order to transmit the data to the cloud or Internet.

Along with use in IoT devices, memory devices can also be used to store information in various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random-access memory (FeRAM), resistive random-access memory (RRAM), and magnetic random-access memory (MRAM), among others.

The memory in an IoT device can be DRAM having one or more memory dies. In some IoT devices that receive sensor data from one or more sensors, the sensor data corresponding to each sensor can be separately stored in a respective memory die. For example, the data from each memory sensor can be respectively stored in separate memory dies ("mono-die configuration"). However, when the processor of the IoT device writes and/or reads the sensor data to/from such mono-die configurations, the peak power consumption due to the number of bits being toggled at the same time during a memory column access can be a problem. To accommodate for the IR voltage drop in these mono-die configurations, the voltage level for memory operations can be increased, which leads to peak power consumption problems. To alleviate the peak power consumption problem, some IoT devices use a stacked memory die arrangement in which the sensor data from each memory sensor is split into multiple data portions and each data portion is stored on a separate memory die. However, to access the appropriate memory location on the memory die, the through-silica-via (TSV) connections in such stacked memory DRAM are arranged such that there is a shift in the connection paths between memory dies. To create the shift in the TSV connections, TSV mask changes may be required during fabrication of the DRAM. The mask changes can lead to a more complex and/or higher cost fabrication process. In addition, the layout and use of the write amplifier/drivers and read amplifiers can cause noise on the power bus in mono-die and conventional stacked memory configurations. Further, in prior art DRAMs, transfer of the data to/from memory cells after initiation of the command signal is done in a single step, which can lead to limits on the amount of data being transferred during each clock cycle period. That is, only one column access select operation is performed for each time period tCCD (column access to column access delay) of the command signal, which can limit the amount of data being transferred during each tCCD clock cycle.

BRIEF DESCRIPTION OF THE DRAWINGS

FIGS. 10A and 10B illustrate block diagrams of exemplary circuits for read and write operations, respectively.

DETAILED DESCRIPTION

As discussed in greater detail below, the technology disclosed herein relates to data transfer in memory components such as, for example, DRAM devices by distributing the column access selection over a clock cycle (period) of a command signal. A person skilled in the art, however, will understand that the technology may have additional embodiments and that the technology may be practiced without several of the details of the embodiments described below with reference to FIGS. 1-11. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

Figure 1:
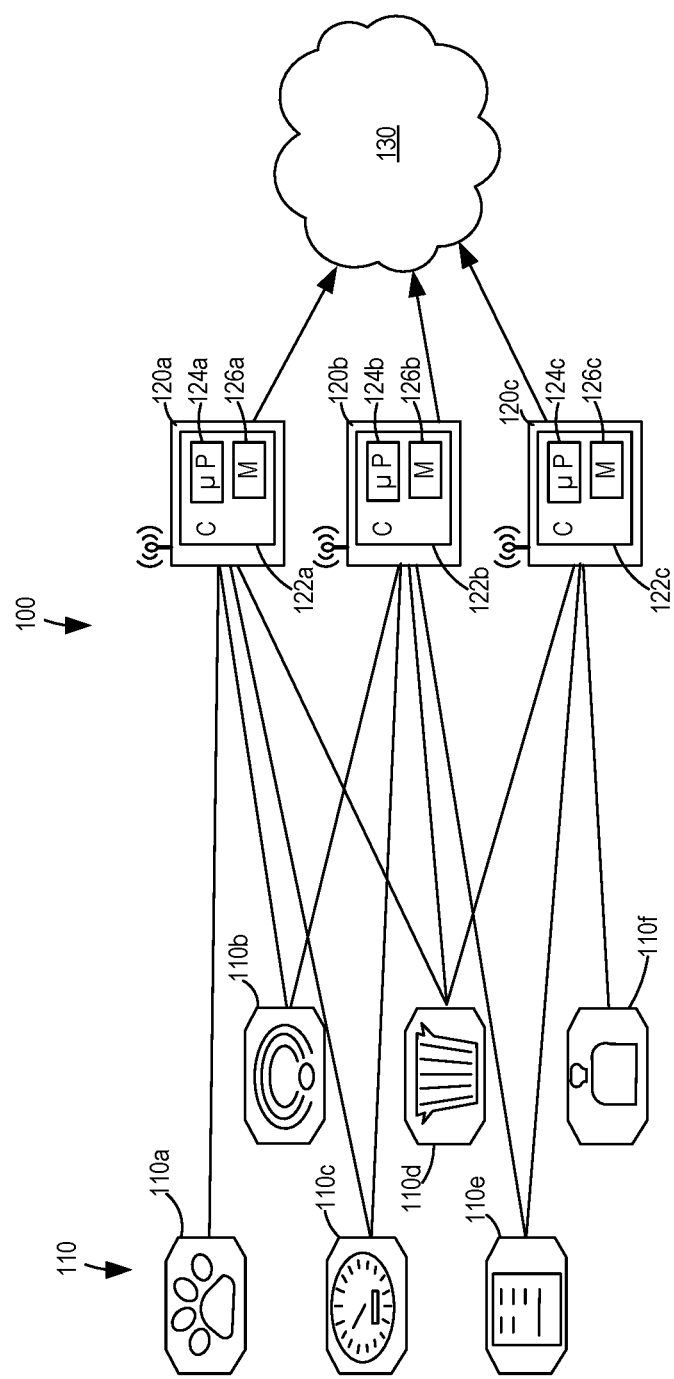
FIG. 1 illustrates a block diagram of an Internet-of-Things system having a memory component in accordance with an embodiment of the present technology.

FIG. 1 illustrates a system having a memory device in accordance with an embodiment of the present technology. FIG. 1 shows a block diagram of an IoT system 100 that can include one or more IoT sensors such as, for example, sensors 110a-f. The IoT sensors 110a-f can be configured as a pet tracker, smoke alarm, water meter, trash container monitor, vending machine monitor, and gas monitoring, respectively. Of course, other types of sensors can be used in the IoT system 100 and one or more of the illustrated sensors need not be included in the IoT system 100. The IoT system 100 can include one or more IoT nodes such as, for example, IoT nodes 120a-c. Each of the sensors 110a-f can be configured to transmit the monitored data to one or more of the IoT nodes 120a-c either wirelessly and/or through a wired connection. The IoT nodes 120a-c can be connected to a network such as, for example, cloud 130 and/or the Internet and/or another type of network in order for remote equipment and/or users to receive the monitored data. In some embodiments, the IoT nodes 120a-c can include controllers 122a-c, respectively, to process the receiving and transmitting of the monitored data. The controllers 122a-c can include processors 124a-c, which are respectively connected to memory components 126a-c. The memory components 126a-c can include, for example, one or more DRAM devices. Of course, in some embodiments, the IoT nodes 120a-c can also include non-volatile memory such as, for example, flash, etc. As part of the monitoring operation and/or based on external requests, the monitored data from one or more sensors 110A-f is written to and/or read from the DRAM device of the IoT node 120a-c.

Figure 2:
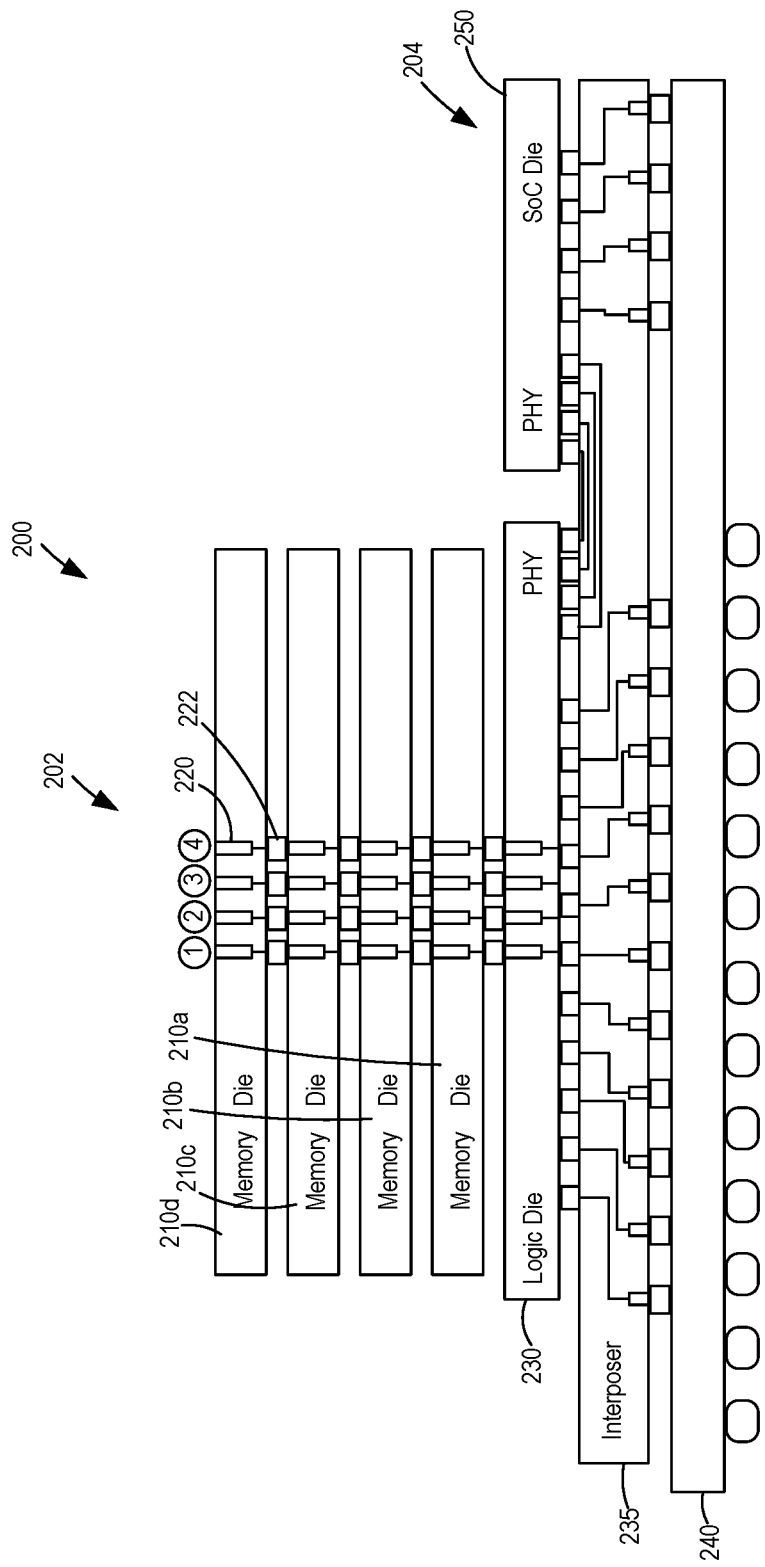
FIG. 2 illustrates a block diagram of a System-on-Chip, including the memory component, that can be used in the system of FIG. 1.

FIG. 2 is a simplified block diagram of a system-on-chip (SoC) system 200 using a stacked memory die configuration. The SoC system 200 can be, for example, the controllers 122a-c used in the IoT nodes 120a-c discussed above. The SoC system 200 can include a memory component 202 and a processor component 204. The memory component 202 can be high bandwidth memory (HBM) or wide I/O memory having a stacked arrangement of one or more memory dies. For example, the memory component 202 can include four memory dies 210a-d stacked on top of each other. Of course, the memory component 202 can have more than four memory dies or less than four memory dies. In some embodiments, the memory dies 210 can be DRAM chips. The memory dies 210a-d can be electrically connected to each other using through silicon vias (TSVs) 220. Of course, for clarity and brevity, only a few of the TSVs are illustrated. The TSVs 220 between memory dies 210a-d can be connected to each other using microbumps 222. The memory component 202 can also include a logic die 230 that can include the common circuits used for controlling the memory operations in memory component 202 and can include an interposer layer 235 that connects the logic die 230 to the package substrate 204. In addition, the processor component 204 can include a SoC die 250 that is connected to the logic die 230 via the interposer layer 235 using the respective PHY connections on the logic die 230 and SoC die 250. In some embodiments, the die 250 can be a graphics processor unit (GPU), a computer processor unit (CPU), or some other type of processor.

In HBM and wide I/O memory, one or more memory arrays in each of the memory dies can be configured to simultaneously activate column select lines to transfer data from/to the memory arrays without conflicts on the data bus. That is, data transferred from/to different memory dies should not use the same main I/O bus lines. In related art systems, to prevent data conflicts, the memory cells can be accessed one die at a time (mono-die configuration), which can lead to peak power issues on the power bus. In other related art systems, data can be simultaneously transferred from/to different memory dies to lower the peak power demand on a power bus. However, the TSV connections between the memory dies in such memory components are shifted so that the simultaneous read/write operations in the memory dies will result in the transfer of data from/to different dies using different portions of the data bus. For example, a TSV in the first column of a memory die can be connected to a TSV in a different column in the adjacent memory die. Thus, the shifting of the TSV order can avoid data conflict. In order to shift the TSV order, however, different TSV masks are used in the fabrication of the memory component 202 between the memory die layers. The use of different masks can increase the complexity and expense of the memory component fabrication process. In addition to the above issues, prior art systems have peak power and/or noise issues with respect to the read amplifiers and/or write drivers when adjacent amplifiers/drivers are used successively.

In exemplary embodiments of the present technology, simultaneous transfer of the data is achievable without the need to shift the TSV order. As seen in FIG. 2, in contrast to related art systems, the connection order of the TSVs 220 between the memory dies 210a-d is the same. That is, the first column of TSVs 220 of memory dies 210a-d are connected to each other. Similarly, the second, third, and fourth columns of TSVs 220 of memory dies 210a-d are respectively connected to each other. For clarity, only four data TSVs are depicted in FIG. 2. However, those skilled in the art understand that the data bus can have any number of TSV connections. As discussed further below, to avoid the data conflict on the data bus without the need to shift the TSV connections, exemplary embodiments of the present technology divide the memory cell array of a memory die into a plurality of data segments. The number of data segments is dependent on the structure of the memory die and is not limiting. In some embodiments, the number of data segments can be in a range of 2 to 8 and, in some embodiments, the number of data segments can be four. Each data segment can be selectively accessed by activating a corresponding column select line ("CSL") and stagger the activation of the CSLs between memory dies.

Figure 3:
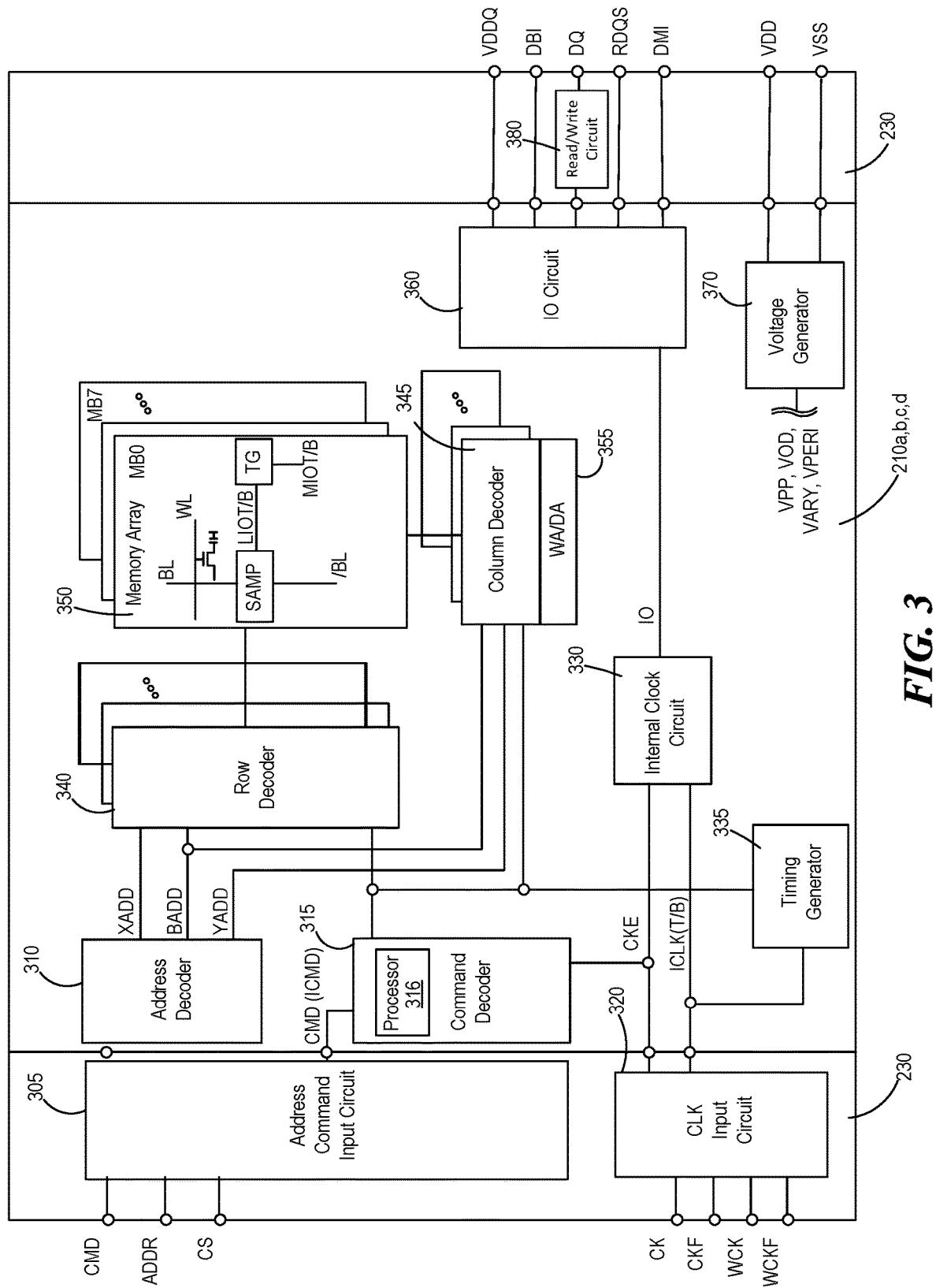
FIG. 3 illustrates a block diagram of a memory die that is can be used in the memory component of FIG. 2.

FIG. 3 is a block diagram schematically illustrating an exemplary embodiment of a memory die, which can be, for example, memory die 210a, 210b, 210c, or 210d connected to the common logic die 230 in accordance with an embodiment of the present technology. The memory die 210 can include one or more banks MB (e.g., banks MB0 to MB7 in the example of FIG. 3), and each bank can include one or more arrays of memory cells, such as memory cell array 350 (also referred to as "memory array" herein). For purposes of clarity and brevity, exemplary embodiments of the present specification will be described with the bank MB0 having one memory array. However, those skilled in the art recognize that each of the banks MB0-MB7 can have more than one memory array. The memory array 350 may include a plurality of word lines (WL), one or more bit lines (BL), and one or more memory cells arranged at intersections of the word lines and the bit lines. The selection of a word line WL and introducing the signal voltage on the word line WL can be performed by a row decoder 340 in combination with word line drivers (not shown). The selection of a bit line BL can be performed by a column decoder 345, which can use global column select lines and/or local column select lines (not shown in FIG. 3) to select the appropriate bit line BL. Sense amplifiers (SA) may be provided for respective bit lines BL and each SA can be connected to a local I/O bus line pair (LIO(T/B)), which may in turn be coupled to a main I/O bus line pair (MIO(T/B)), via transfer gates (TG), which can function as switches.

The logic die 230 may employ a plurality of external terminals to communicate with an memory controller and/or host processor such as, for example, processor component 204. The external terminals can include command terminals and address terminals coupled to a command bus and an address bus. The command bus and the address bus can receive command signals ("CMD signals") and address signals ADDR, respectively. The logic die 230 can further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from a memory controller and/or host processor such as, for example, processor component 204. The address signal and the bank address signal supplied to the address terminals can be transferred, via a command/address input circuit 305, to, for example, the memory dies 210a-d. For example, the address signal and the bank address signal can be supplied to an address decoder 310 in the appropriate memory die 210a,b,c,d. The address decoder 310 can receive the address signals and supply a decoded row address signal (XADD) to the row decoder 340, and a decoded column address signal (YADD) to the column decoder 345. The address decoder 310 can also receive the bank address signal (BADD) and supply the bank address signal to both the row decoder 340 and the column decoder 345.

The command and address terminals of the logic die 230 can be supplied with CMD signals, address signals ADDR, and chip selection signals CS, from a memory controller and/or host processor (e.g., processor component 204). The CMD signals may represent various memory commands from the memory controller including, for example, access commands, which can include read commands and write commands. The select signal CS may be used to select the memory component 202 to respond to commands and addresses provided to the command and address terminals. When an active CS signal is provided to the memory component 202, the commands and addresses can be decoded, and memory operations can be performed. The CMD signals can be provided to a command decoder 315 via the command/address input circuit 305 of the logic die 230. The command decoder 315 can include a processor 316 (and/or other circuits) to decode the CMD signals to generate various internal signals and commands for performing memory operations. In some embodiments, the CMD signals can be provided as internal command signals ICMD to the various circuits in memory dies 210a,b,c,d, The processor 316 can execute the instructions to (and/or other circuits can be configured to) generate row and column command signals and/or the associated timing signals (e.g., in coordination with the timing generator 335) to select a word line and/or a bit line to perform the desired memory operation (e.g., read, write). Of course, the processor/circuitry to generate the command and/or timing signals can be located in another component of the memory component 202 such as, for example, address command input circuit 305 and/or an external controller/processor.

When a read command is issued and a row address and a column address are timely supplied with the read command, data can be read from the appropriate memory cells in the memory array 350 based on the row address and the column address. The read command may be received by the command decoder 315, which can provide internal commands to input/output (I/O) circuit 360 so that read data can be output from the data terminals DQ, RDQS, DBI, and DMI via read/write amp module (WA/DA) 355, the I/O circuit 360, and the read/write circuit 380 (discussed below).

When a write command is issued and a row address and a column address are timely supplied with the write command, data can be supplied to the data terminals DQ, DBI, and DMI according to the WCK and WCKF clock signals. The write command may be received by the command decoder 315, which can provide internal commands to the I/O circuit 360 so that the write data can be received by data receivers in the I/O circuit 360 via the read/write circuit 380 (discussed below) and supplied to the memory array 350 via the amp module 355. The write data can be written to the appropriate memory cells in the memory array 350 based on the row address and the column address. The write data may be provided to the data terminals at a time that is defined by write latency WL information. Operation of the I/O circuit 360 is known to those skilled in the art and thus, for brevity, will not be discussed.

The power supply terminals may be supplied with power supply potentials VDD and VSS. These power supply potentials VDD and VSS can be supplied to an internal voltage generator circuit 370. The internal voltage generator circuit 370 can generate various internal potentials VPP, VOD, VARY, VPERI, VCC, VCCP, VCCP2, and the like based on the power supply potentials VDD, VNWL, and VSS. The internal potential VPP can be used in the row decoder 340, the internal potentials VOD and VARY can be used in the sense amplifiers included in the memory array 350, and the internal potential VPERI can be used in many other circuit blocks.

Clock input circuit 320 of logic die 230 can receive external clock signals and generate various internal clock signals for use in the memory component 202. For example, the clock input circuit 320 can receive the external clock signals to generate internal clock signal pair ICLK_T and ICLK_B. The internal clock signals ICLK(T/B) can be supplied to an internal clock circuit 330. The internal clock circuit 330 can provide various phase and frequency controlled internal clock signals based on the received internal clock signals ICLK and a clock enable signal CKE from the command/address input circuit 305. For example, the internal clock circuit 330 can include a clock path (not shown in FIG. 3) that receives the internal clock signals ICLK(T/B) and provides various clock signals to various circuits such as, for example, complementary even phase clock signal PCLKE and odd phase clock signal PCLKO (collectively "phase clock signal PCLK(E/O)" or "PCLK(E/O) signal") to the command decoder 315, timing generator 335, and/or column decoder 345. The internal clock circuit 330 can further provide input/output (IO) clock signals. The IO clock signals can be supplied to the input/output circuit 360 and can be used as a timing signal for determining an output timing of read data and the input timing of write data. The IO clock signals can be provided at multiple clock frequencies so that data can be output from and input to the memory component 202 at different data rates. A higher clock frequency may be desirable when high memory speed is desired. A lower clock frequency may be desirable when lower power consumption is desired. In some embodiments, the internal clock signals ICLK(T/B) can be supplied to a timing generator 335 to generate the PCLK(E/O) signal and/or other various internal clock signals.

Typically, a memory array, such as memory array 350, can have a plurality of column select lines and the number of column select lines can be based on the bandwidth of the data bus (e.g., the MIO bus) and the number of bits in a word line WL. For example, a 128-bit data bus connected to a memory array with a 1024-bit word line can have 8 CSLs that are selectively activated by column access signals to allow access to memory cells for transferring data between the memory cells and the data bus. The corresponding memory arrays on the other dies will have a similar CSL configuration. As discussed above, in related art systems, one method of avoiding a data conflict on the data bus is to shift the TSV connection path or use a mono-die configuration. In exemplary embodiments of the present technology, however, each of the memory arrays 350 in the memory dies 210a-d can be divided into a plurality of data segments and access to each of the plurality of data segments can be selectively controlled by activating a corresponding column select line so as to not create a data conflict on the MIO(T/B) bus line. Thus, while the CSL of related art systems activates the entire memory array, the CSL of the present technology activates a data segment in the memory array.

Figure 4:
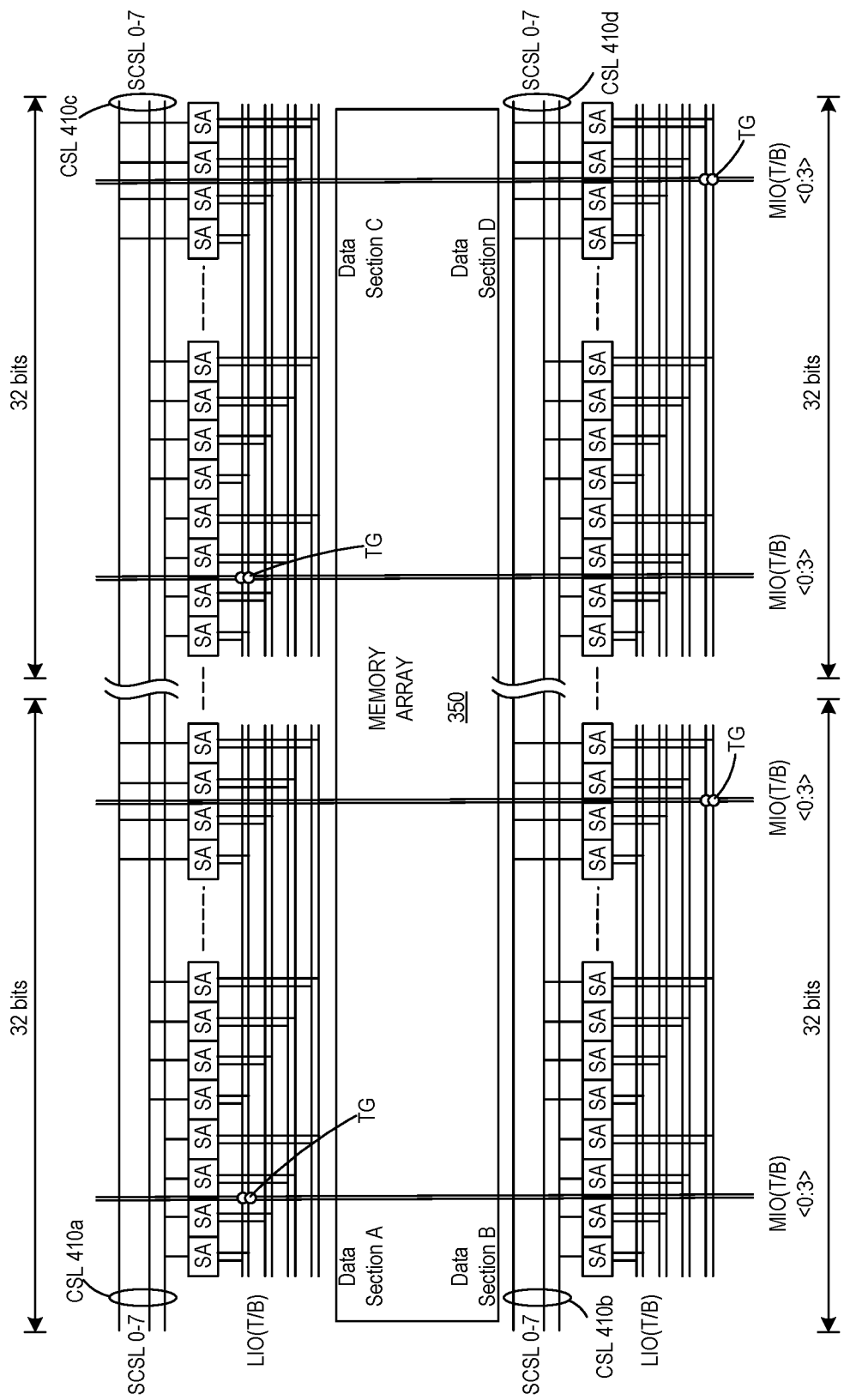
FIG. 4 illustrates a block diagram of a memory cell array in the memory die of FIG. 3.

For example, in some embodiments, each memory array 350 can include a plurality of CSLs that, based on a column access signal, control access to the appropriate data segment of the plurality of data segments for the memory array 350. In exemplary embodiments, activation of CSLs within a memory die and between memory dies can be controlled such that no two data segments of a data unit can be accessed simultaneously. As used herein, "data unit" means data segments of different memory dies whose memory cells connect to the same data lines of a data bus (e.g., LIO(T/B) bus and/or MIO(T/B) bus). As seen in FIG. 4, the memory arrays 150 in each of the memory dies 210a-d can be divided into four data segments A-D. For example, the data from sensor 110a can be divided and stored in a data segment in one or more memory dies 210a-d. As discussed below, the data to be transferred during a specified memory operation can be stored using a pattern that does not include data segments that are part of a same data unit.

In some embodiments, each data segment A-D can be accessed based on activation of a column select line that corresponds to that data segment. For example, in the exemplary embodiment of FIG. 4, CSLs can be used to access respective data segments A-D. For example, one or more memory arrays can be divided into data segments A-D and each data segment A-D can be accessed by activating CSLs 410a, 410b, 410c, or 410d, respectively. For clarity, only one memory array in one memory die is shown. Each CSL 410a-d represents eight Sub-CSLs (e.g., SCSL 0-7). The appropriate SCSL0-7 for the CSL 410a-d can be individually activated based on the desired memory cell to be accessed. For clarity and brevity, the present disclosure will refer to the activation of CSL 410a-d, but those skilled in the art will recognize that activation of a CSL 410a-d means that an appropriate individual SCSL0-7 is activated for the respective CSL 410a-d depending on the memory cell to be accessed. Depending on the structure of the memory component 202, the CSLs 410a-d can be global column select lines or local column select lines or some combination of both.

As seen in FIG. 4, the CSLs 410a-d are connected to sense amplifiers and, when activated, turn on the corresponding SA of the bit line BL of the memory cell to be accessed. If the memory operation is a write operation, the value of the LIO(T/B) line corresponding to the activated CSL and the activated WL is written to the desired memory cell. If the memory operation is a read operation, the value of the memory cell corresponding to the memory cell activated by the CSL and the activated word line WL is transferred to the LIO(T/B) and then to the MIO(T/B) via the switch TG. As seen in FIG. 4, the bus pairs MIO(T/B)-A, MIO(T/B)-B, MIO(T/B)-C, and MIO(T/B)-D connect to CSL 410a-d, respectively.

In some embodiments, the configuration of the memory component 202 is such that the MIO(T/B) buses of the memory dies 210a-d are connected to each other. For example, the memory cells corresponding to CSL 410a in each memory die 210a-d can be connected in parallel to the MIO(T/B)-A data bus. That is, the data segments A of memory dies 210a-d belong to a data unit and share the same portion of a data bus, which in this case is the MIO(T/B)-A bus. Similarly, the data segments B-D of memory dies 210a-d respectively connect to each other (e.g., parallel connections to the respective MIO(T/B)-B-D buses) to form data units. For clarity, the exemplary illustration in FIG. 4 only shows two MIO(T/B) pairs for each data segment A-D. However, each data segment A-D can have 32 MIO(T/B) pairs.

In exemplary embodiments, CSLs from different memory dies can be simultaneously activated to access memory cells of data segments in different memory dies that are not part of a same data unit. The CSLs are simultaneously activated using an activation pattern that ensures data from a given data segment is transferred to/over a portion of the MIO bus (and/or LIO bus) that is different from the portions used by the other data segments. For example, an activation pattern for the CSLs can include the selection of at least one CSL 410a-d in each memory die 210a-d to allow for simultaneously data transfer to/from different memory dies 210a-d, but the activation pattern also ensures data is not transferred to/from data segments that are part of a same data unit. That is, the activation pattern for the CSLs ensures that no two data segments A, no two data segments B, no two data segments C, and no two data segments D of the memory dies 210a-d are accessed at the same time for data transfer. In some embodiments, to transfer all the data to/from the data segments A-D, a plurality of activation patterns can be used to activate the CSLs while ensuring data is not transferred from data segments that are part of a same data unit. The plurality of activation patterns can be implemented in a plurality of phases that are distributed (spread out) over at least a portion of the CMD signal period. For example, the plurality of activation patterns can be implemented one at a time (e.g., one activation pattern per phase) to transfer all the data to/from the respective memory arrays 350 of the memory dies 210a-d during, for example, a single period of the CMD signal. The number of activation patterns can correspond to the number of data segments that the memory array 350 is divided into. In some embodiments, one or more patterns of the plurality of activation patterns can be predetermined and programmed into the memory component 202. The plurality of activation patterns can also be collectively referred to herein as a "staggered activation pattern." The staggered activation pattern can be implemented during a single CMD signal phase. An exemplary staggered activation pattern is provided in Table 1.

TABLE 1

STAGGERED ACTIVATION PATTERN

COMMAND SIGNAL PERIOD

| Memory Die | Phase 1 Transfer of Data1 | Phase 2 Transfer of Data2 | Phase3 Transfer of Data3 | Phase 4 Transfer of Data4 |
|---|---|---|---|---|
| 210a | A (CSL 410a) | C (CSL 410c) | B (CSL 410b) | D (CSL 410d) |
| 210b | D (CSL 410d) | A (CSL 410a) | C (CSL 410c) | B (CSL 410b) |
| 210c | B (CSL 410b) | D (CSL 410d) | A (CSL 410a) | C (CSL 410c) |
| 210d | C (CSL 410c) | B (CSL 410b) | D (CSL 410d) | A (CSL 410a) |

As seen in Table 1, the first column lists the memory die and columns 2-5 list the data segment (e.g., A, B, C, or D) from/to which data sets (e.g., Data1-4) are transferred. Columns 2-5 also list the column select line (CSL 410a-d) that is activated in the appropriate memory die 210a-d when performing the transfer. Each column 2-5 represents an activation pattern for activating CSLs used during the respective phase (e.g., Phase 1-4) of the CMD signal period, and the activation patterns collectively represent a staggered activation pattern that is implemented during a single CMD signal period. The activation patterns used in activating the CSLs can vary in order to simultaneously access data in different memory dies without causing a data conflict on the data buses (e.g., LIO(T/B) and/or MIO(T/B)). That is, the activation pattern for each phase (e.g., Phase 1-4) is such that data segments that are part of a same data unit are not selected, and the activation pattern for the next phase is then shifted or staggered to ensure all data sets (e.g., Data1-4) are transferred without a conflict on the data buses. As discussed above, Data1, Data2, Data3, and Data4 can represent four data sets to be transferred during a single CMD signal clock cycle period. Each data set Data1-4 can represent data from a separate sensor or the four data sets Data1-4 can represent data from a single sensor (or some combination of thereof).

To transfer the data sets (e.g. Data1-4), the column access signals for activating the CSLs are distributed over the CMD signal period (also referred to herein as "distributed column access signals"). For example, in some embodiments, the distributed column access signals can be set (e.g., to a high state) during certain phases (e.g., Phases 1-4) of the CMD signal period. In addition, an individual command signal (referred to herein as a "phase command signal") based on the CMD signal can be set at each phase (e.g., Phases 1-4) to initiate memory operations (e.g., read or write). In some embodiments, the phase command signals can correspond to the distributed column access signals. As seen in Table 1, data set Data1 can be transferred to/from the appropriate data segments of memory die 210a during a first transfer phase of the CMD signal period. In the first transfer phase, the appropriate distributed column access signals are set to activate the CSLs 410a,d,b,c of memory dies 210a-d and the appropriate phase command signals are set (e.g., to a high state) in each memory die 210a-d to transfer data set Data1, which is stored in data segments A,D,B,C of memory dies 210a-d, respectively. During phases 2-4, data sets Data2-4 are similarly transferred as shown in Table 1 by initiating the appropriate distributed column access signals the appropriate phase command signals. The timing and generation of the phase command signals and the distributed column access signals are discussed in more detail below.

Figure 5:
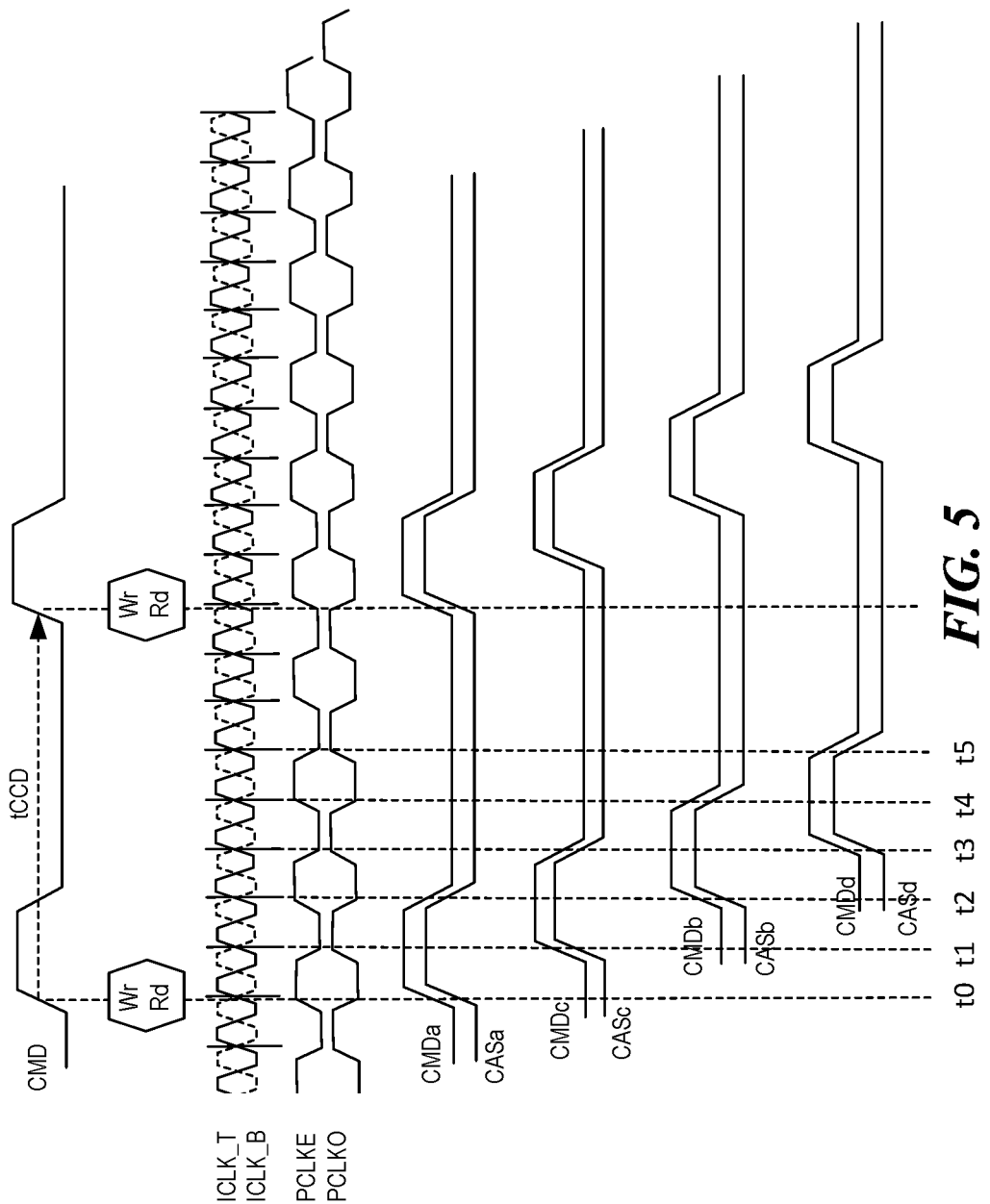
FIG. 5 illustrates an exemplary timing diagram for a phased command signals and a distributed column access signals for the memory component of FIG. 2.

FIG. 5 is an exemplary timing diagram 500 showing a phase command signal sequence and a distributed column access signal sequence in accordance with the present technology. As seen in FIG. 5, CMD signal 510 (also referred to herein as "CMD signal 510") corresponds to memory operations (e.g., write or read) and has a period of tCCD. The CMD signal 510 can be a main command signal for read/write memory operations that is, for example, generated by the processor component 204 (or an external host processor). The CMD signal 510 can be an external command signal received by the memory component 202. In some embodiments, the address command input circuit 305 can generate an internal ICMD signal based on the CMD signal 510, and the ICMD signal can be used in the generation of the phase command signals and the distributed column access signals discussed below. For example, after generation of the ICMD signal, the address command input circuit 305 can then transmit the ICMD signal to each of the memory dies 210a-d for use in generating the phase command signals and the distributed column access signals in each memory die 210a-d. However, for clarity, the generation of the phase command signals and the distributed column access signals will be described below with reference to the CMD signal 510.

As discussed further below, in some embodiments, memory operations on the memory array 350 can be distributed (spread out) over CMD signal period tCCD by using a plurality of phase command signals to perform the memory operations at different times over the period tCCD. For example, the phase command signals CMDa-d can be based on the CMD signal 510, and the phase command signals CMDa-d can be used for memory operations in respective data segments A-D. The phase command signal sequence (e.g., the order of the phase command signals CMDa, CMDb, CMDc, CMDd) can be based on the memory die 210a-d and/or can be different for each memory die 210a-d. In some embodiments, the phase command signal sequence is based on an activation pattern such as, for example, the activation patterns in each column of Table 1. For example, FIG. 5 shows the phase command signal sequence of Table 1 for memory die 210a: CMDa signal for Phase 1, CMDc signal for Phase 2, CMDb signal for Phase 3, and CMDd signal for Phase 4. For clarity, FIG. 5 only shows the sequences for memory die 210a. However, the sequences for the other memory dies 210b-d can similarly follow the activation patterns shown in Table 1. For each memory die 210a-d, phase command signals CMDa-d can be generated during the period tCCD of the CMD signal 510 based on rising and/or falling edges of the phase clock signal PCLK(E/O). The phase clock signal PCLK(E/O) can be generated based on the internal clock signals ICLK(T/B). The internal clock signals ICLK(T/B) can be based on an external clock signal that is received by the memory component 202.

Distributed column access signals CASa, CASb, CASc, CASd used to activate CSLs 410a-d, respectively, can be generated based on the CMD signal 510. In some embodiments, the distributed column access signal sequence is based on an activation pattern such as, for example, the activation patterns in each column of Table 1. For example, FIG. 5 shows the distributed column access signal activation sequence of Table 1 for memory die 210a: CASa signal for activating CSL 410a in Phase 1, CMDc signal for activating CSL 410c in Phase 2, CMDb signal for activating CSL 410b in Phase 3, and CMDd signal for activating CSL 410d in Phase 4. For clarity, FIG. 5 only shows the sequences for memory die 210a. However, the sequences for the other memory dies 210b-d can similarly follow the activation patterns shown in Table 1. Similar to the phase command signals CMDa-d, the distributed column access signals CASa-d can be generated at different times during the period tCCD of the CMD signal 510 based on rising and/or falling edges of the phase clock signal PCLK(E/O). In some embodiments, the generation of the column access signals CASa-d can correspond to the generation of the phase command signals CMDa-d. In some embodiments, for example as shown in FIG. 5, each distributed column access signal CASa-d can be in phase with a respective phase command signal CMDa-d. In some embodiments, each distributed column access signal CASa-d and the respective phase command signal CMDa-d can be the same signal.

As discussed above, the phase clock signal PCLK(E/O) can be generated in each of the memory dies 210a-d based on the internal clock signals ICLK(T/B). For example, the phase clock signal PCLK(E/O) can be generated in the internal clock circuit 330, timing generator 335, and/or another circuit. In other embodiments, the phase clock signal PCLK(E/O) can be generated in the logic die 230 (and/or in some other external device) and transmitted to each of the memory dies 210a-d. For example, the phase clock signal PCLK(E/O) can be generated in the CLK input circuit 320 based on the external clock signals CK and CKF. As seen in FIG. 5, two cycles of the clock signal ICLK(T/B) can represent one cycle of the phase clock signal PCLK(E/O). However, in other embodiments, the ratio of clock signal ICLK(T/B) to the phase clock signal PCLK(E/O) can be greater than 2 or less than 2. In some embodiments, external clock signals CK and CKF can be used to generate the PCLK(E/O) signal.

As seen in FIG. 5, the frequency of the PCLK(E/O) signal can be higher than that of the CMD signal 510. Based on the CMD signal 510 and the PCLK(E/O) signal, a plurality of phase command signals can be generated over the period tCCD. For example, generation of the phase command signals CMDa-d (also referred to herein as "CMDa-d signals") and the distributed column access signals CASa-d (also referred to herein as or "CASa-d signals") can be based on the rising and/or falling edge of the PCLK(E/O) signal. In some embodiments, the frequency of the PCLK(E/O) signal can depend on the number of memory dies in the memory component 202. In some embodiments, the setting (e.g., a change to a high state) of the CMDa-d signals and/or the CASa-d signals can be triggered off of the PCLK(E/O) signal. For example, the setting of the CMDa-d signals and/or the CASa-d signals can be triggered off of the rising edge and/or the falling edge of the PCLK(E/O) signal. In the exemplary embodiment of FIG. 5, the setting of the CMDa-d signals and the CASa-d signals are triggered by the rising edge of the PCLKE signal or the rising edge of the PCLKO signal. By using the PCLK(E/O) signal to trigger the setting (e.g., change to a high state) of the CASa-d signals and the CMDa-b signals at different times during the period tCCD of the CMD signal 510, access to and memory operations on the data segments A-D can be distributed throughout the period tCCD instead of the data set transfers occurring at the same time.

The PCLK(E/O) signal can be synchronized to the CMD signal 510 such that, when the CMD signal 510 is set (e.g., rises to high state), the rising edge of the CMD signal 510 triggers the even phase clock signal PCLKE to also rise to a high state and the complementary odd phase clock signal PCLKO falls to a low value. The PCLK(E/O) signal can be used to trigger each phase (e.g., Phases 1-4 in Table 1) during the period tCCD of the CMD signal 510. For example, the generation of the first phase command signal and the first distributed column access signal can correspond to the initial rise of the PCLKE signal that is in synchronization with or after the rise of the CMD signal 510. With reference to Table 1, the first phase command signal can relate to transferring data such as, for example, data set Data1 to/from the appropriate data segments A-D of the memory dies 210a-d as shown the Phase 1 column. Similarly, the first distributed column access signal for memory dies 210a-d can relate to selecting the column access line corresponding to the appropriate data segment A-D in Phase 1. With the appropriate CMD and CAS signals for Phase 1 set, data set Data1 can be simultaneously transferred to/from data segments A,D,B,C in the respective memory dies 210a-d. The phase command signals and the distributed column access signals corresponding to the second, third and fourth phases (e.g., Phases 2-4 in Table 1) can be generated in a similar way but the generation of these signals are distributed over the period tCCD. The phase command signals and the distributed column access signals for Phases 2-4 can relate to transferring, for example, Data2, Data3, and Data4, respectively, to/from the appropriate data segment A-D in each of the memory dies 210a-d (e.g., the data segments identified in Table 1).

In some embodiments, a data set to be transferred can be segmented into data portions and each data portion can be stored in a different memory die. For example, data set Data1 can be segmented into portions that are stored in data segments A,D,B,C in the respective memory dies 210a-d. The activation pattern for Phase 1 ensures that the Data1 portions are transferred without a conflict on the data bus because data segments A,D,B,C in the respective memory dies 210a-d are not part of a same data unit. Similarly, data sets Data2-4 can be segmented into portions and stored in data segments of different memory dies in a manner consistent with the activation patterns shown in Table 1. As seen in FIG. 5, the phase command signals and the distributed column access signals can be set (e.g., set to a high state) for two system clock cycles to ensure data transfer. However, the number of system clock cycles that the phase command signals and the distributed column access signals are set high can be less than two cycles or greater than two cycles, as desired.

In some embodiments, the command decoder 315 in each memory die 210a-d can be configured to generate the phase command signals and the distributed column access signals. The command decoder 315 can receive the PCLK(E/O) signal and generate each of the phase command signals and the distributed column access signals in the appropriate sequence for the memory die 210a-d. For memory die 210a (see FIG. 5) the phase command signal and the distributed column access signal sequences can correspond to, for example, CMDa/CSAa→CMDc/CASc→CMDb/CASb→CMDd/CASd. The generation of the phase command signal and the distributed column access signal sequences in memory dies 210b-d (not shown in FIG. 5) can correspond to, for example: CMDd/CASd→CMDa/CASa→CMDc/CASc→CMDb/CASb for memory die 210b; CMDb/CASb→CMDd/CASd→CMDa/CASa→CMDc/CASc for memory die 210c; and CMDc/CASc→CMDb/CASb→CMDd/CASd→CMDa/CASa for memory die 210d.

The generation of the phase command signal and the distributed column access signal sequences will be given with respect to memory die 210a. As seen in FIG. 5, at time t0 (e.g., Phase 1), the rise of the PCLKE signal can set (e.g., at a high state) the CMDa and CASa signals. When the CMDa and CASa signals are set, data can be transferred to/from data segment A. For example, a portion of data set Data1 can be transferred to/from data segment A of memory die 210a. Of course, along with the data being transferred to/from data segment A of memory die 210a, the other portions of the data set Data1 (and/or or some other data) can be simultaneously transferred to/from the appropriate data segments B,C,D in the other memory dies 210b-d (e.g., see Table 1).

At time t1 (e.g., Phase 2), the CMDc and CASc signals can be set (e.g., to a high state) on the next rising edge of the PCLKO signal after the CMDa and CASa signals are set. When the CMDc and CASc signals are set, data can be transferred to/from the data segment C. For example, a portion of Data2 can be transferred to/from data segment C of memory die 210a. Of course, along with the data being transferred to/from data segment C of memory die 210a, the other portions of the data set Data2 (and/or some other data) can be simultaneously transferred to/from the appropriate data segments A,B,D in the other memory dies 210b-d (e.g., see Table 1).

At time t2 (e.g., Phase 3), the CMDb and CASb signals can be set (e.g., set to a high state) on the next rising edge of the PCLKE signal after the CMDc and CASc signals are set. When the CMDb sand CASc signals are set, data can be transferred to/from the data segment B. For example, a portion of data set Data3 can be transferred to/from data segment B of memory die 210a. Of course, along with the data being transferred to/from data segment B of memory die 210a, the other portions of the data set Data3 (and/or some other data) can be simultaneously transferred to/from the appropriate data segments A,C,D in the other memory dies 210b-d (e.g., see Table 1).

At t3 (e.g., Phase 4), the CMDd and CASd signals can be set (e.g., to a high state) on the next rising edge of the PCLKO signal after the CMDb and CASb signals are set. When the CMDd and CASd signals are set, data can be transferred to/from the data segment D. For example, a portion of data set Data4 can be transferred to/from data segment D of memory die 210a. Of course, along with the data being transferred to/from data segment D of memory die 210a, the other portions of the data set Data4 (and/or some other data) can be simultaneously transferred to/from the appropriate data segments A,B,C in the other memory dies 210b-d (e.g., see Table 1). In the timing diagram 500, the phase shift between each of the phase command signals and between each of the distributed column access signals is 12.5% of tCCD. However, in other embodiments, the phase shift between each of the phase command signals and/or the column access signals can be different. For example, the phase command signals and/or the column access signals can be set such that the Phases 1-4 correspond to 0%, 25%, 50%, and 75% of tCCD.

Figure 6A:
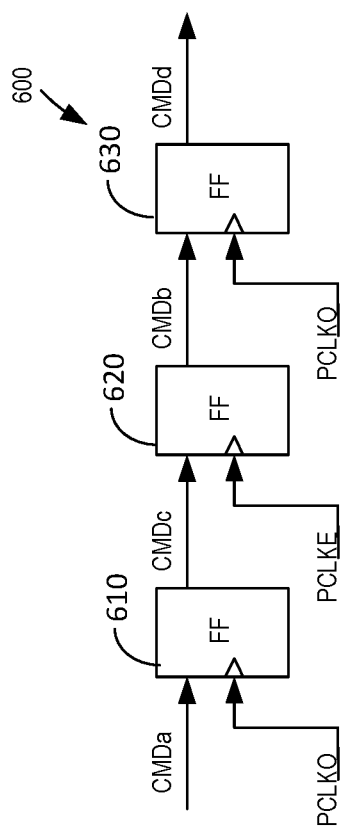
FIG. 6A illustrates a phase command signal circuit for generating the phased command signals in FIG. 5.

FIG. 6A illustrates an exemplary phase command signal circuit 600 for generating the phase command signals CMDa-d shown in FIG. 5. In some embodiments, the phase command signal circuit 600 can be disposed in each of the memory devices 210a-d. For example, the phase command signal circuit 600 can be disposed in the command decoder 315 and/or another circuit in each of memory dies 210a-d. For clarity, the phase command signal circuit 600 is described with respect to memory die 210a. However, those skilled in the art understand that the phase command signal circuits in memory dies 210b-d will be similar.

FIG. 6A illustrates a phase command signal circuit 600 that can generate the phase command signals such as, for example CMDa-d signals discussed above. In some embodiments, the initial phase command signal can correspond to the CMD signal 510. In this case, the phase command signal circuit 600 does not generate the initial phase command signal, but merely receives the first phase command signal as shown in FIG. 6A. For example, for memory die 210a, the first phase command signal CMDa can be generated with the CMD signal 510. In some embodiments, the CMDa signal and the CMD signal 510 can be in phase with each other, and in some embodiments, the CMDa signal and CMD signal 510 can be the same signal. Similarly, for the other memory dies 210b-d, the initial phase command signal can be generated with or be the same as the CMD signal 510. The phase command signal circuit 600 can provide the phase command signal sequence corresponding to the activation pattern of the memory die. For example, as shown in FIG. 6A, memory die 210a can have a phase command signal sequence that is as follows: CMDa→CMDc→CMDb→CMDd. Similarly, phase command signal circuits in memory dies 210b-d (not shown) can provide phase command signal corresponding to the respective activation patterns for memory dies 210b-d, as follows: CMDd→CMDa→CMDc→CMDb; CMDb→CMDd→CMDa→CMDc; and CMDc→CMDb→CMDd→CMDa. Of course, the phase command sequences can be different than those discussed above so long as data is not transferred to/from data segments that are part of a same data unit at the same time.

As seen in FIG. 6A, the phase command signal circuit 600 includes flip-flop (FF) circuits 610, 620, and 630. The initial phase command signal CMDa can be generated in another circuit and, along with initiating the memory operation in data segment A at Phase 1, the CMDa signal can be an input to the phase command signal circuit 600 for the generation of the CMDc,b,d signals. For example, the CMDa signal can be sent to the data input of FF circuit 610. The clock input of the FF circuit 610 can receive the PLCKO signal, and the output of the FF circuit 610 can be the CMDc signal used to initiate a memory operation in data segment C at Phase 2. The data input of FF circuit 620 can receive the CMDc signal. The clock input of the FF circuit 620 can receive the PLCKE signal, and the output of the FF circuit 620 can be the CMDb signal used to initiate a memory operation in data segment B at Phase 3. The data input of FF circuit 630 can receive the CMDb signal. The clock input of FF circuit 630 can receive the PLCKO signal, and the output of the FF circuit 630 can be the CMDd signal used to initiate a memory operation in data segment D at Phase 4.

Figure 6B:
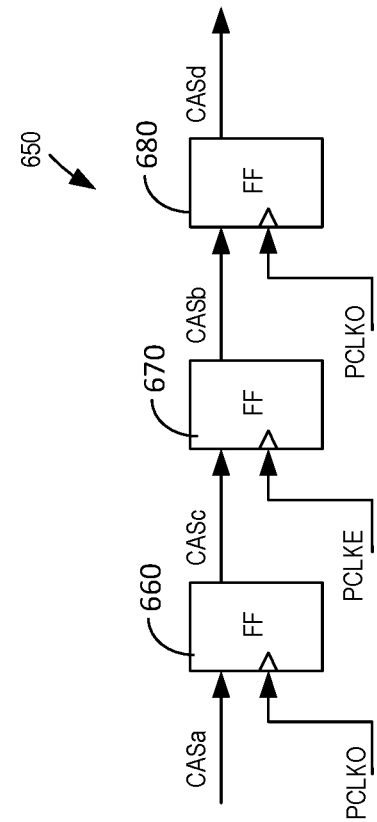
FIG. 6B illustrates a distributed column access signal circuit for generating the distributed column access signals in FIG. 5.

FIG. 6B illustrates an exemplary distributed column access signal circuit 650 for generating the distributed column access signals CASa-d shown in FIG. 5. In some embodiments, the distributed column access signal circuit 650 can be disposed in each of the memory devices 210a-d. For example, the distributed column access signal circuit 650 can be disposed in the column decoder 345 and/or another circuit in each of memory dies 210a-d. For clarity, the distributed column access signal circuit 650 is described with respect to memory die 210a. However, those skilled in the art understand that the distributed column access signal circuits in memory dies 210b-d will be similar.

In some embodiments, similar to the phase command signal circuit 600, the initial distributed column access signal can correspond to the CMD signal 510. In this case, the distributed column access signal circuit 650 does not generate the initial distributed column access signal, but merely receives the first distributed column access signal.

For example, for memory die 210a, the first distributed column access signal CASa can be generated with the CMD signal 510 and received by the distributed column access signal circuit 650. In some embodiments, the CASa signal and the CMD signal 510 can be in phase with each other, and in some embodiments, the CASa signal and CMD signal 510 can be the same signal. In some embodiments, the CMDa signal and the CASa signal can be the same signal. Similarly, for the other memory dies 210b-d, the initial distributed column access signal can be generated in synchronization with or be the same as the CMD signal 510 or be the same signal as the respective phase command signals for the memory dies 210b-d.

The distributed column access signal circuit 650 can provide the distributed column access signal sequence corresponding to the activation pattern of the memory die. For example, as seen in FIG. 6B, memory die 210a can have a distributed column access signal sequence that is as follows: CASa→CASc→CASb→CASd. Similarly, distributed column access signal circuits in memory dies 210b-d (not shown) can provide distributed column access signal corresponding to the respective activation patterns for memory dies 210b-d, as follows: CASd→CASa→CASc→CASb; CASb→CASd→CASa→CASc; and CASc→CASb→CASd→CASa. Of course, the distributed column access sequences can be different than those discussed above so long as data is not transferred to/from data segments that are part of a same data unit at the same time.

As seen in FIG. 6B, the distributed column access signal circuit 650 includes FF circuits 660, 670, and 680. As discussed above, the initial distributed column access signal CASa can be generated in another circuit and, along with selecting CSL 410a in data segment A at Phase 1, the CASa signal can be an input to the distributed column access signal circuit 650. For example, the CASa signal can be sent to the data input of FF circuit 660. The clock input of the FF circuit 660 can receive the PLCKO signal, and the output of the FF circuit 660 can be the CASc signal used to select CSL 410c of data segment C at Phase 2. The data input of FF circuit 670 can receive the CASc signal. The clock input of the FF circuit 670 can receive the PLCKE signal, and the output of the FF circuit 670 can be the CASb signal used to select CSL 410b of data segment B at Phase 3. The data input of FF circuit 680 can receive the CASb signal. The clock input of FF circuit 680 can receive the PLCKO signal, and the output of the FF circuit 680 can be the CASd signal used to select CSL 410d of data segment D at Phase 4.

With reference to FIGS. 5, 6A, and 6B, at point t0 (Phase 1), the first phase command signal CMDa and the corresponding CASa signal are set (e.g., in a high state) to transfer the first portion of data set Data1 from/to data segment A. The CMDa and CASa signals are input to FF circuits 610 and 660, respectively, and the PLCKO signal is the clock input to FF circuits 610 and 660. At point t1 (Phase 2), with the PLCKO signal on its rising edge, the FF circuit 610 sets the CMDc signal (e.g., to a high state) and the FF circuit 660 sets the CASc signal (e.g., to a high state). With CMDc and CASc signals set, the first portion of data set Data2 is transferred from/to data segment C. The CMDc and CASc signals are input to FF circuits 620 and 670, respectively, and the PLCKE signal is the clock input to FF circuits 620 and 670.

At point t2 (Phase 3), with the PLCKE signal on its rising edge, the FF circuit 620 sets the CMDb signal (e.g., to a high state) and the FF circuit 670 sets the CASb signal (e.g., to a high state). With CMDb and CASc signals set, the first portion of data set Data3 is transferred from/to data segment B. The CMDb and CASb signals are input to FF circuits 630 and 680, respectively, and the PLCKO signal is the clock input to FF circuits 630 and 680. At point t3, the PLCKO signal is on its rising edge again but this time the CMDa and CASa signals are reset (e.g., to a low state). Thus, the FF circuits 610 and 660 respectively reset the CMDc and CASc signals (e.g., to a low state). Still at point t3 (Phase 4), with the PLCKO signal on its rising edge, the FF circuit 630 sets the CMDd signal (e.g., to a high state) and the FF circuit 680 sets the CASd signal (e.g., to a high state). With the CMDd and CASd signals set, the first portion of data set Data4 is transferred from/to data segment D.

At point t4, the PLCKE signal is on its rising edge again and the CMDc and CASc signals are reset (e.g., to a low state). Thus, the FF circuits 620 and 670 respectively reset the CMDb and CASb signals (e.g., to a low state). At point t5, the PLCKO signal is on its rising edge again and the CMDb and CASb signals are reset (e.g., to a low state). Thus, FF circuits 630 and 680 respectively reset the CMDd and CASd signals (e.g., to a low state). A similar stagger sequence can be simultaneously performed in the other memory dies 210b-d so long as the remaining data portions of data sets Data1-4 are not transferred from data segments that are part of a same data unit at the same time.

In the above exemplary embodiments, the phase command signal circuit 600 and the distributed column access circuit 650 can be disposed in each memory die and configured to have a different CMD/CAS signal sequences (e.g., CMD/CAS signal sequences corresponding to the respective activation patterns for each memory die). However, the different sequences can require different hard circuit configurations between the memory dies 210a-d, which could complicate manufacturing. Accordingly, in some exemplary embodiments of the present technology, a common phase command signal generation circuit can be used by a plurality of memory dies, and each memory die can generate the individual CMD signals and/or corresponding CAS signals using a same signal generation circuit.

Figures 7A, 7B:
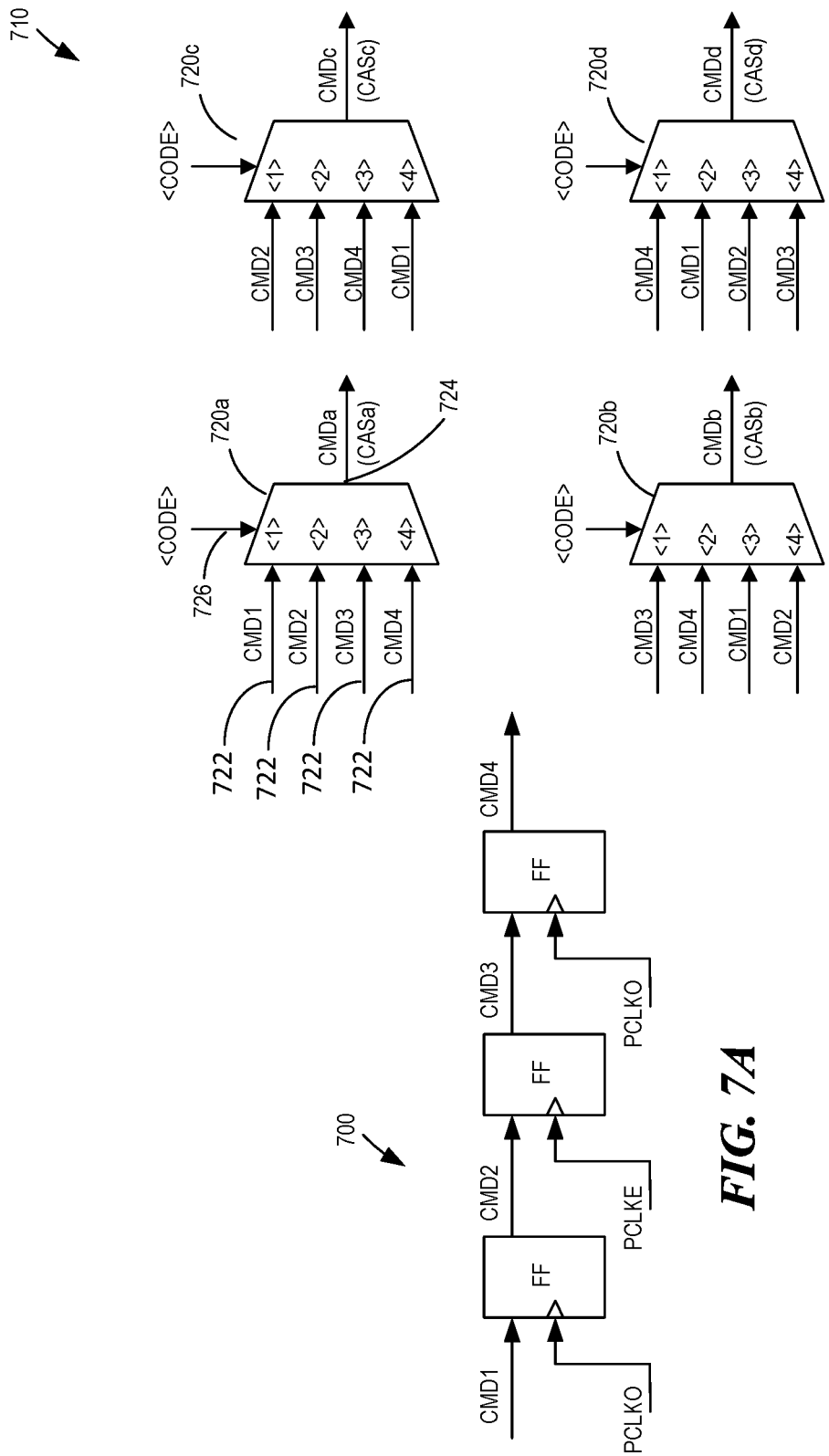
FIGS. 7A and 7B respectively illustrate a common command signal circuit and a stagger circuit for generating phase command signals/column access signals in accordance with an embodiment of the present technology.

FIG. 7A illustrates a common phase command signal circuit 700 that generates common phase command signals such as, for example, common phase command signals CMD1, CMD2, CMD3, and CMD4 that can be transmitted to each memory die 210a-d to generate individual phase command signals such as, for example, phase command signals CMDa-d and, in some embodiments, the distributed column access signals CASa-d in the proper activation pattern for each memory die 210a-d. The operation of the common phase command signal circuit 700 is similar to the phase command signal circuit 600 discussed above and thus, for brevity, the operation of the common phase command signal circuit 700 will not be repeated. Similar to the generation of the phase commands signals CMDa discussed above, the first phase command signal CMD1 can be in-phase with or the same as the main command signal such as, for example, CMD signal 510. The generation of phase command signals CMD2-CMD4 can be similar to that described above with respect to phase command signals CMDb-d. In exemplary embodiments, the common phase command signal circuit 700 and the phase clock generation circuit (not shown) for generating the PCLK(E/O) signal can be in logic die 230. For example, the common phase command signal circuit 700 and the phase clock generation circuit can be part of address command input circuit 305 and/or some other circuit in logic die 230. The common phase command signals CMD1-4 output from the common phase command signal circuit 700 can be transmitted to a stagger circuit in each of the memory dies 210a-d. The stagger circuits set individual phase command signals and/or distributed column access signals according to the sequences discussed above for transferring data (e.g., data sets Data1-4) from/to each of the memory dies 210a-d based on a staggered activation pattern (e.g., Table 1).

FIG. 7B illustrates an exemplary embodiment of a stagger circuit in accordance with the present technology. In some embodiments, each memory die can include a stagger circuit 710 that is connected to the outputs of the common phase command signal circuit 700 (e.g., using TSVs and/or some other connections). The stagger circuit 710 can include a plurality of phase command signal selector circuits 720 (also referred to herein as "selector circuits 720") corresponding to the number of data segments in a memory array. Each selector circuit 720 can include one or more signal inputs 722 configured to accept common phase command signals (e.g., the CMD1-4 signals) from the common phase command signal circuit 700. Each selector circuit 720 can include an output 724 that is configured to output a selected input signal as an individual phase command signal to the appropriate data segment in the memory array 350. The outputs of each signal selector circuits 720 in a memory die can be configured to connect to different data segments such that no two selector circuits 720 are connected to the same data segment. Each selector circuit 720 can also include a program input 726 configured to accept a program code for configuring the selector circuit 720. The program code configures the selector circuit 720 to select one of the common phase command signals at inputs 722 as the signal to transmit to the output 724.

As seen in FIG. 7B, the stagger circuit 710 in each of the memory dies 210a-d can include four signal selector circuits 720a-d. Each selector circuit 720a-d can correspond to a data segment A-D in the respective memory die 210a-d. For example, the output 724 of selector circuit 720a can be individual phase command signal CMDa that is connected to data segment A. Similarly, the outputs of selector circuits 720b-d can be individual phase command signals CMDb-d that are respectively connected to data segments B-D. Each selector circuit 720a-d can receive common phase command signals CMD1-4 at inputs 722 (e.g., at inputs 1-4). Based on the program code, each selector circuit 720a-d can select one of the common phase command signals CMD1-4 and output the common phase command signal as one of the individual phase command signals CMDa-d. As seen in FIG. 7B, the order of the common phase command signals CMD1-4 at the inputs 722 can vary between the selector circuits 720a-d such that no two selector circuits 720a-d in the same memory die have the same order. However, the order of the common phase command signals at the selector circuits 720 of the stagger circuits 710 can be the same between memory dies 210a-d. That is, the stagger circuits 710 can be the same in each memory die 210a-d. The variation in the order of the common phase command signals CMD1-4 at the inputs 722 of each selector circuit 720a-d in a memory die can correspond to a staggered activation pattern such as, for example, the staggered activation pattern shown in Table 1.

In some embodiments, based on the program code that is received at the program input 726, each selector circuit 720a-d can be configured to select the appropriate common phase command signal CMD1-4. The programming of the selector circuits 720a-d and/or the order of the common phase command signals CMD1-4 at the inputs 722 can be set such that data segments from memory dies 210a-d that are part of a same data unit are not selected when data is transferred from/to the memory component 202. By having a programmable configuration for the selector circuits 720a-d instead of a fixed configuration (such as, for example, the circuits in FIGS. 6A and 6B), the same circuit structure for the stagger circuit 710 can be used for all memory dies 210a-d. Thus, fabrication of the memory dies 210a-d in memory component 202 is less complex than if the stagger circuits had different structures. In some embodiments, the programming of the selector circuits 720a-d can be done at the factory. The programming can be fused such that, once programmed, the selector circuits 720a-d cannot be reprogrammed. In other embodiments, the selector circuits 720a-d can be reprogrammable.

In some embodiments, the program code for configuring the selector circuits 720a-d can be based on the memory die. For example, in some embodiments, each selector circuit 720a-d for a memory die can be programmed to select a specific input such as, for example, one of inputs <1> to <4> and output the incoming signal on the selected input as the individual phase command signal to the appropriate data segment. For example, for memory die 210a, the selector circuits 720a-d can be programmed to select input <1>. Thus, the selector circuit 720a can output the input CMD1 signal as phase command signal CMDa, selector circuit 720b can output the input CMD2 signal as phase command signal CMDb, selector circuit 720c can output the input CMD3 signal as phase command signal CMDc, selector circuit 720d can output the input CMD4 signal as phase command signal CMDd. Similarly, each selector circuit 720a-d in memory die 210b can be programmed to select, for example, input <2>, each selector circuit 720a-d in memory die 210c can be programmed to select, for example, input <3>, and each selector circuit 720a-d in memory die 210d can be programmed to select, for example, input <4>. Table 2 provides an exemplary selection pattern for the embodiment of FIG. 7B.

TABLE 2

| Memory Die (Input Selection) | Selector Circuit 720a | Selector Circuit 720b | Selector Circuit 720c | Selector Circuit 720d |
| --- | --- | --- | --- | --- |
| 210a (Input 1) | CMD1→CMDa | CMD2→CMDc | CMD3→CMDb | CMD4→CMDd |
| 210b (Input 2) | CMD2→CMDa | CMD3→CMDc | CMD4→CMDb | CMD1→CMDd |
| 210c (Input 3) | CMD3→CMDa | CMD4→CMDc | CMD1→CMDb | CMD2→CMDd |
| 210d (Input 4) | CMD4→CMDa | CMD1→CMDc | CMD2→CMDb | CMD3→CMDd |

As seen in Table 2, the selector circuits 720a-d of each memory die 210a-d can be configured to select one of the inputs (e.g., inputs <1> to <4>). At Phase 1, when the CMD1 signal is set (e.g., at a high state), the appropriate selector circuit 720a-d in each of the memory dies 210a-d outputs the appropriate individual phase command signal CMDa-d based on how the selector circuits 720a-d in each of the stagger circuits 710 are programmed. For example, with reference to Table 2, in memory die 210a the selector circuits 720a-d are programmed to select input <1>. Accordingly, inputs <2> to <4> of the selector circuits 720a-d are not activated and not used once programmed. Because the outputs of the selector circuits 720*a-d* follow the selected input <1>s in memory die 210*a*, the CMDa signal will be set (e.g., at a high state) when the CMD1 signal is set, and the CMDb,c,d signals will be reset (e.g., at a low state) because common phase command signals CMD2-4 will be reset (e.g., at a low state). In memory die 210*b* where the selector circuits 720*a-d* are programmed to select input <2>, when CMD1 signal is set and CMD2-4 are reset, the CMDd signal will be set while the CMDa,b,c signals will be reset. Similarly, in memory die 210*c* where the selector circuits 720*a-d* are programmed to select input <3>, when CMD1 signal is set and CMD2-4 are reset, the CMDb signal will be set while the CMDa,c,d signals will be reset. Finally, in memory die 210*d* where the selector circuits 720*a-d* are programmed to select input <4>, when CMD1 signal is set and CMD2-4 are reset, the CMDd signal will be set while the CMDa,b,c signals will be reset. Thus, when the CMD1 signal is set, data from different data segments A-D in memory dies 210*a-d* is simultaneously transferred. As seen in Table 2 and FIGS. 7A and 7B, data from the other data segments A-D in memory dies 210*a-d* can be transferred in a similar way as the other common phase command signals CMD2-4 are sequentially set (e.g., set to a high state).

As discussed above, when the individual phase command signal for a given data segment A-D is set, the corresponding distributed column access signal that selects the appropriate CSL is also set (e.g., to a high state) at the same time. Accordingly, to provide the corresponding CAS signal, the memory component 202 can have stagger circuit for the CAS signals that is similar to that of stagger circuit 710. For example, as seen in FIG. 7B, the corresponding CAS signals, CASa, CASb, CASc, and CASd signals, are shown in parenthesis. Because the stagger circuit for the CAS signals will be similar to that of the stagger circuit for the CMD signals, for brevity, the description of the CAS stagger circuit is omitted. In some embodiments, the CMDa-d signals and the CASa-d signals can be generated by the same stagger circuits. In some embodiments, the CMDa-d signals and the CASa-d signals can be the same signals, and in such cases, separate CAS stagger circuits may not be need. An exemplary stagger pattern for the CASa-d signals that is compatible with the CMDa-d signals in Table 2 is shown in Table 3.

portions D1*a-d* can be stored in the data segments A-D of the memory dies 210*a,c,d,b* using a pattern that ensures that data portions D1*a-d* are not stored in data segments that are part of a same data unit. That is, the data portions D1*a-d* can be stored such that no two data portions of D1*a-d* are in the same data unit. As discussed above, each data unit can include data segments that share a data bus (represented by dotted lines in FIG. 8A). For example, all data segments A of memory dies 210*a-d* can represent a first corresponding data segment. Similarly, all data segments B can represent a second data unit, all data segments C can represent a third data unit, and all data segments D can represent a fourth data unit.

Figure 8A:
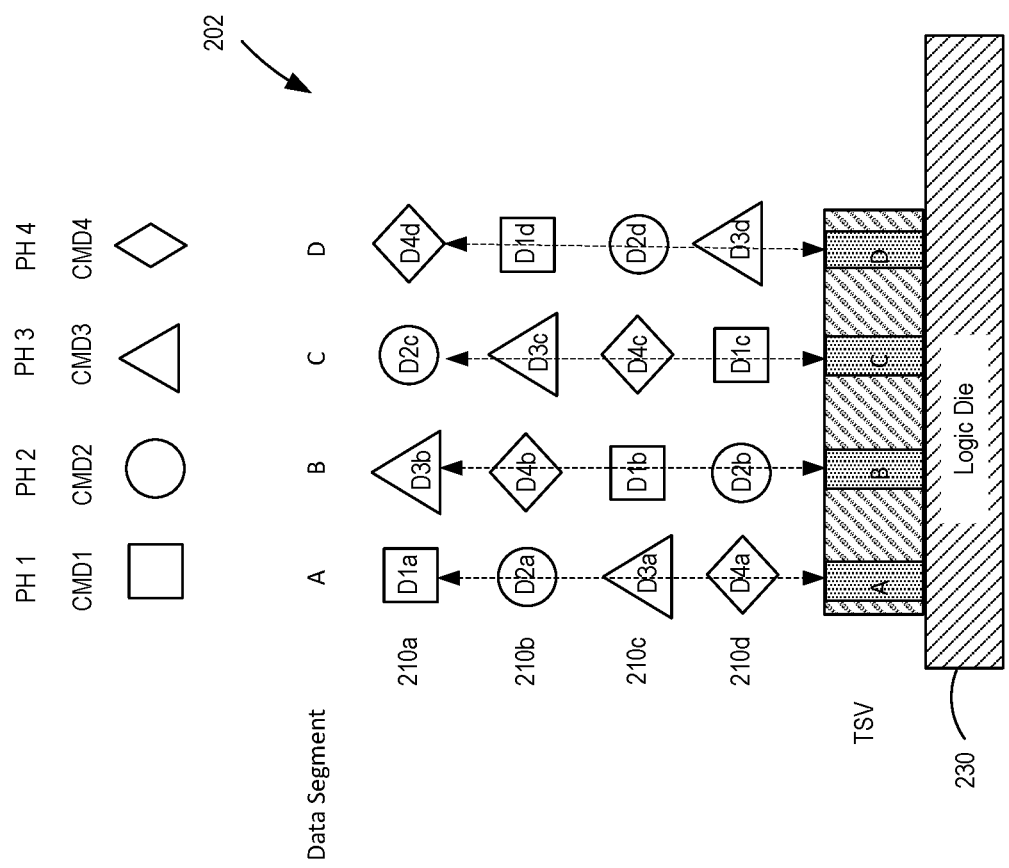
FIG. 8A illustrates a block diagram of data storage in the memory component.

In some embodiments, for example as seen in FIG. 8A, the data portions D1*a-d* and the other data portions (e.g., data portions of data sets Data2-4) can be stored in a pattern among the data segments A-D of memory dies 210*a-d* that corresponds to the staggered activation pattern of Table 1. In some embodiments, each set of data portions for Data1-4 can be separately transferred during a respective Phase 1-4 of the CMD signal period tCCD corresponding to, for example, CMD1-4. For example, the data portions D1*a-d* are shown with a square symbol to indicate that the data is transferred to/from the respective data segments during the CMD1 signal phase. As seen in FIG. 8A, data portion D1*a* can be stored in data segment A of memory die 210*a*, data portion D1*b* can be stored in data segment B of memory die 210*c*, data portion D1*c* can be stored in data segment C of memory die 210*d*, and data portion D1*d* can be stored in data segment D of memory die 210*b*. During the CMD1 signal, data portions D1*a*, D1*b*, D1*c*, and D1*d* are simultaneously transferred via TSVs A-D, respectively, to the logic die 230 and to, for example, the processor component 204. Similarly, data sets Data2-4, which can be data from, for example, sensors 110*b-d*, can be split into a plurality of portions such as, for example, D2*a-d*, D3*a-d*, and D4*a-d*. Similar to data portions D1*a-d*, the data portions D2*a-d*, D3*a-d*, and D4*a-d* can be stored in the data segments A-D of the memory dies 210*a-d* using an activation pattern that corresponds to the staggered activation pattern of Table 1. The data portions D2*a-d* are shown with a circle symbol to indicate that the data is transferred to/from the respective data segments during the CMD2 signal phase. During the

TABLE 3

| Memory Die | Sel. Cir. 720a | Sel. Cir. 720b | Sel. Cir. 720c | Sel. Cir. 720d |
|---|---|---|---|---|
| 210a (Input 1) | CMD1→CASa | CMD2→CASc | CMD3→CASb | CMD4→CASd |
| 210b (Input 2) | CMD2→CASa | CMD3→CASc | CMD4→CASb | CMD1→CASd |
| 210c (Input 3) | CMD3→CASa | CMD4→CASc | CMD1→CASb | CMD2→CASd |
| 210d (Input 4) | CMD4→CASa | CMD1→CASc | CMD2→CASb | CMD3→CASd |

FIG. 8A illustrates an exemplary data arrangement in a memory component 202 of, for example, an IoT node 120. For example, the memory component 202 can be that of IoT node 120*a* and can store the data sets Data1-4 from, for example, sensors 110*a-d*, respectively (see FIG. 1). In exemplary embodiments, as discussed above, each data set Data1-4 can be split into a plurality of data portions, and the respective data portions can be stored in data segments (e.g., data segments A-D) of one or more memory dies such that the stored portions are not in data segments that are part of a same data unit. For example, as seen in FIG. 8A, the data set Data1 can be split into four portions D1*a*, D1*b*, D1*c*, and D1*d* and each portion can be respectively stored in data segments in memory dies 210*a,c,d,b*. For example, the data CMD2 signal, data portions D2*a*, D2*b*, D2*c*, and D2*d* are simultaneously transferred via TSVs A-D, respectively. Similarly, D3*a-d* and D4*a-d* are shown with the triangle and diamond symbols, respectively, to indicate that the data is transferred during the CMD3 and CMD4 signal phases. During the CMD3 and CMD4 signals, the respective data portions for data sets Data3 and Data4 are simultaneously transferred via TSVs A-D. Of course, the data portions can be stored in the data segments using other patterns so long as data portions are not transferred from/to a same data unit at the same time.

Figure 8B:
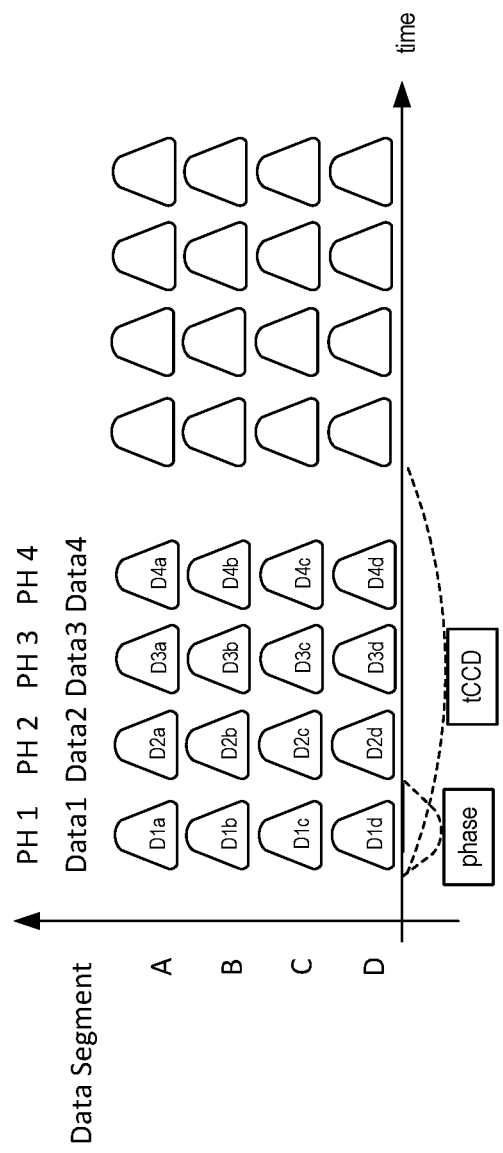
FIG. 8B illustrates a block diagram of data transfer from the memory component.

As discussed above, data sets Data1-4 can be transferred from/to the logic die 230 via LIO(T/B) and/or MIO(T/B) buses (represented by the dotted lines) using TSVs A-D. For example, data portions D1a-d can be transferred simultaneously via TSVs A-D during CMD1 (Phase 1). Because the data portions D1a-d are transferred simultaneously, each data portion D1a-d is transferred via a different TSV such as, for example, via TSVs A-D, respectively. Similarly, each set of data portions D2a-d, D3a-d, and D4a-d can be simultaneously transferred during the respective CMD2-4 (Phase 2-4) using TSVs-A-D. As seen in FIG. 8B, the four data sets Data1, Data2, Data3, and Data4 can be transferred every period tCCD of CMD signal 510. In contrast, related art systems that use a mono-die type configuration or use the TSV-shift configuration can only transfer one data set, for example, Data1, Data2, Data3, or Data4, every period tCCD of CMD signal 510.

Figure 9A:
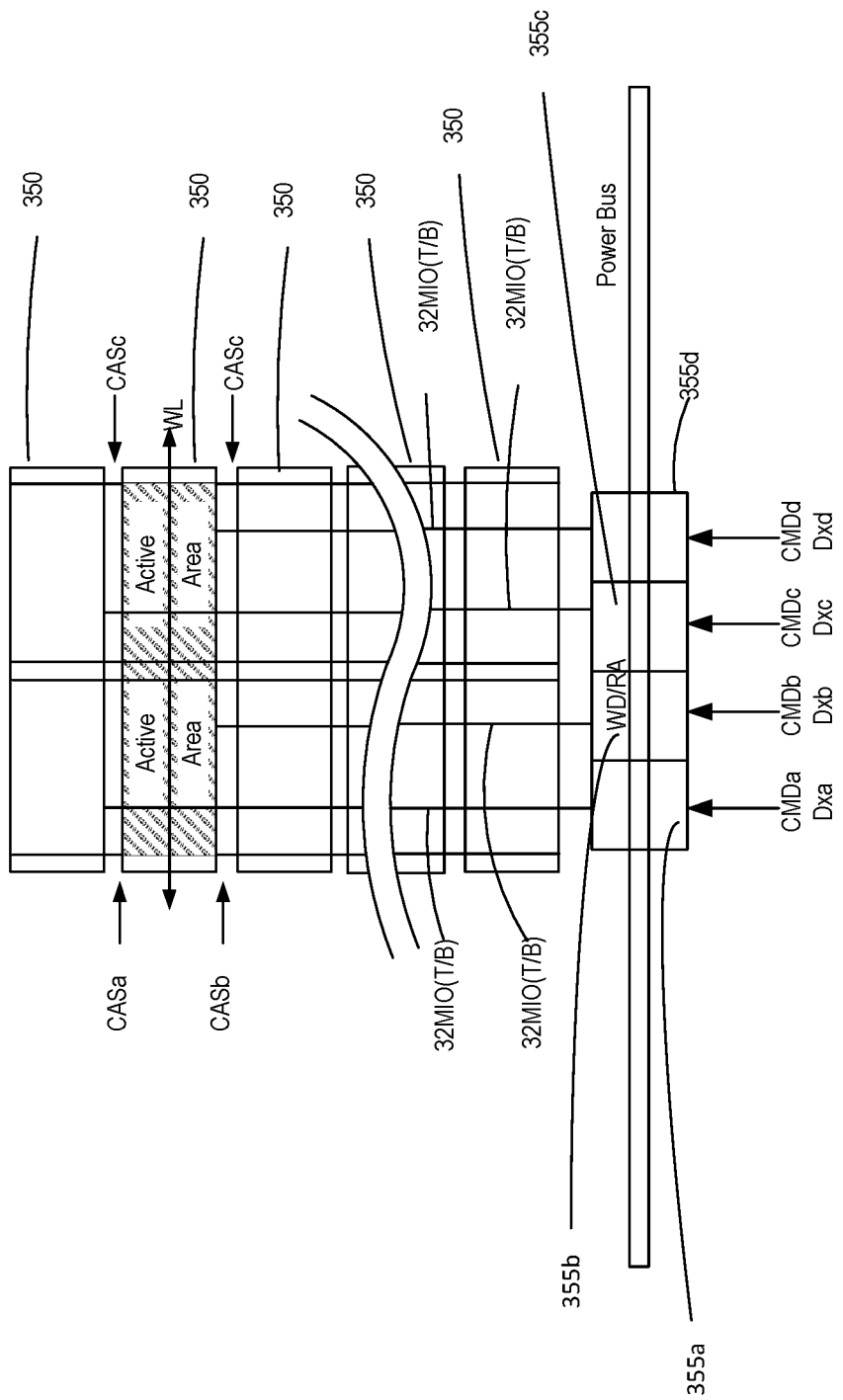
FIGS. 9A and 9B illustrate exemplary block layout diagrams of memory cell arrays in the memory die of FIG. 3.

FIG. 9A shows a block layout diagram of memory arrays with corresponding amplifiers/drivers. FIG. 9A illustrates a section of a memory die 210 having a plurality of memory arrays 350. In some embodiments, the memory arrays 350 can be disposed on the same bank and/or on different banks MB0-7. The memory array 350 labeled "Active Area" corresponds to the row being accessed by the row decoder 340. As discussed above, instead of one column select line as in related art systems, the column select line is divided into, for example, four portions CSL 410a-d. Based on the address signals ADDR, one of the CSLs 410a-d is activated by the column decoder 345 to allow access the desired data segment A-D in the Active Area. Data to/from the selected data segment A-D is transferred using the corresponding MIO(T/B) bus line. As seen in FIG. 9A, the read/write amp module 355 can include one or more amp modules that are connected to the MIO(T/B) bus lines. For example, the read/write amp module 355 can include four amp modules 355a-d. Each amp module 355a-d can be connected to 32 MIO(T/B) bus lines, which correspond to data segments A-D. For example, amp module 355a can be connected to the 32 MIO(T/B) bus lines for data segment A. The amp module 355a can receive the CMDa signal to transfer data portion Dxa (where x corresponds to the data set and the data layout in the memory dies can be, for example, the data layout in FIG. 8A). Similarly, amp module 355b-d can be connected to the 32 MIO(T/B) bus lines for data segments B-D, respectively. The amp modules 355b-d can receive the CMDb-d signals to transfer data portions Dxb-Dxd (e.g., see data layout in FIG. 8A). For read operations, the amp modules 355a-d can include read amplifiers that further amplify the data signal from the sense amplifiers SA. For write operations, the amp modules 355a-d can include write amplifiers/drivers to set the MIO(T/B) bus voltage at the proper level for writing the data to the appropriate memory cell. Each of the amp modules 355a-d can be connected to power bus 356, which supplies the voltage/current needed to operate the amp modules 355a-d.

As discussed above, amp modules 355a-d receive the CMDa-d signals and the corresponding data portions Dxa-d designated for the respective data segments A-D. When the CMDa-d signal for a data segment A-D is set active, the appropriate read or write circuit in the amp module 355a-d are turned ON based on whether the CMDa-d signal is for writing the data to the memory cell or reading the data from the memory cell. In related art systems that include only one column select line for a memory array, the number of data bits being toggled on a given command signal can cause peak power issues. However, by dividing the column access line in to a plurality of column select lines (e.g., CSL 410a-d) and distributing the activation of the CSLs over the period tCCD of the CMD signal as discussed above, the power drawn by the amp modules is spread out over the period tCCD, which reduces the peak power draw on any given amp module. In addition, the staggered activation pattern for the CAS signals that activate the CSL 410a-d can be changed to reduce the noise on the power bus. Using an activation pattern in which adjacent amp modules 355 are turned ON sequentially between phases (e.g., Phase 1 to Phase 2) can cause noise on the power bus. To mitigate the noise, the staggered activation pattern for activating the CSLs can be such that amp modules that are adjacent to one another, such as, for example, amp modules 355a and 355b or amp modules 355c and 355d, are not sequentially turned on between phases. An exemplary activation sequence for the CSLs that can help reduce noise on the power bus can correspond to the staggered activation pattern of Table 1. For example, the amp modules 355 can be turned ON as follows: amp module 355a (CSL 410a), amp module 355a (CSL 410c), amp module 355a (CSL 410b), and amp module 355a (CSL 410d). Of course, other sequences can be used to ensure adjacent amp modules 355a-d are not tuned ON sequentially.

Figure 9B:
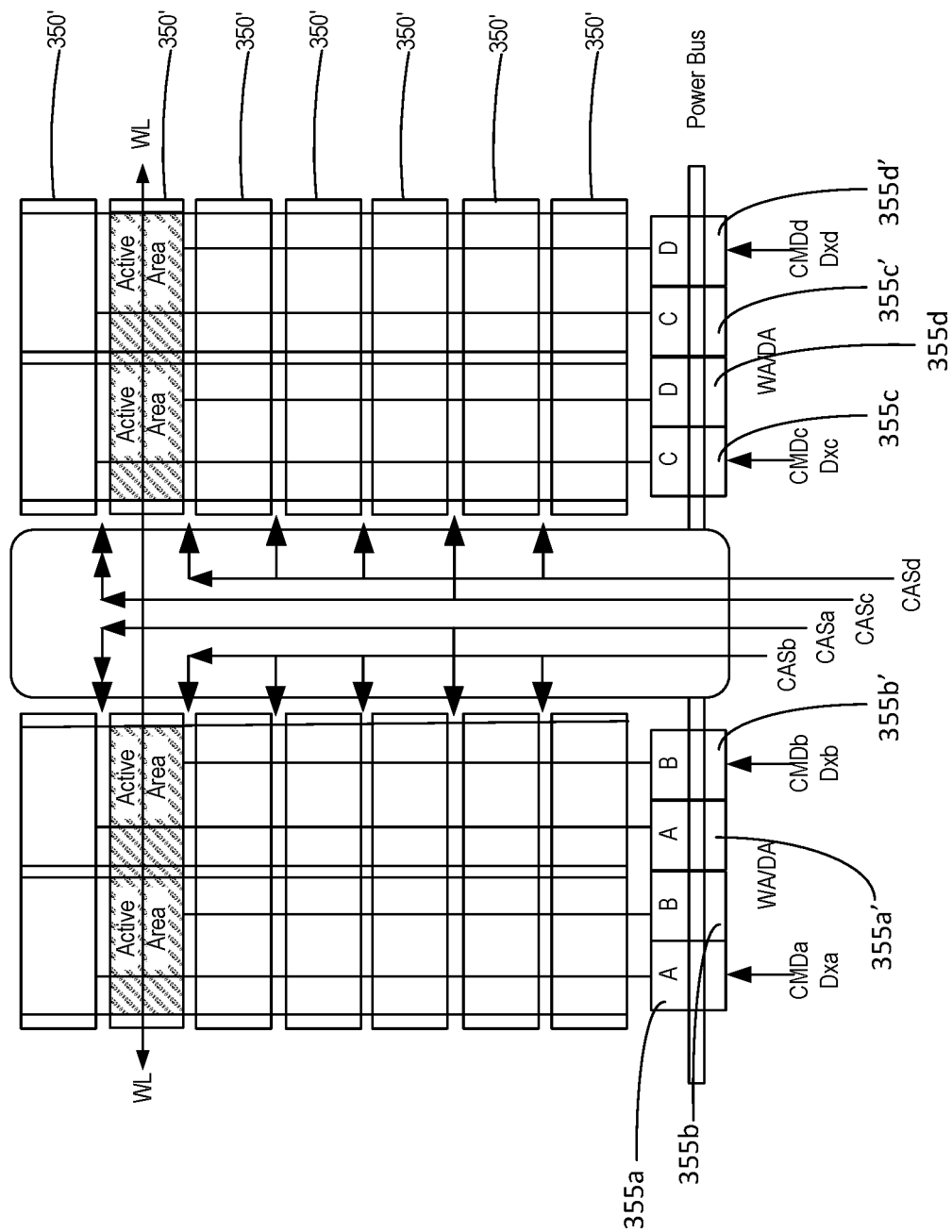

FIG. 9B shows another block layout diagram of memory arrays with corresponding amplifiers/drivers. The layout of the memory arrays in FIG. 9B differs from that of FIG. 9A in that the memory array 350' uses a 512-bit data bus instead of the 256-bit data bus of memory array 350 in FIG. 9A. As seen FIG. 9B, each CSL corresponds to two sets of 32-bit MIO(T/B) bus lines that respectively connect to amp modules 355. For example, CSL 410a includes two 32-bit MIO(T/B) bus lines that respectively connect to amp modules 355a and 355a'. Similarly, CSLs 410b-d each include two 32-bit MIO(T/B) bus lines that connect to 355b,b', 355c,c', and 355d,d', respectively. Thus, although each data segment A-D has two amp modules, both amp modules will work together when the phase command signal (e.g., CMDa-d signal) is set to transfer the corresponding data portions Dxa-d designated for the respective data segment A-D.

FIGS. 10A and 10B illustrate simplified block diagrams of circuits used in read and write operations, respectively. FIG. 10A illustrates a read circuit 1000 for reading data stored in the memory dies using the appropriate TSV connections. For example, the read circuit 1000 can read Data1-4 (which can correspond to data from IoTs 110a-d) stored in memory dies 210a-d using the TSV A-D connections (see FIG. 8A). The TSV A-D connections can correspond to, for example, the MIO(T/B) data bus connected to the IO circuit 360 of each memory die 210a-d. The read circuit 1000 can be part of read/write circuit 380 in the logic die 230 and connect to the IO circuit 360 of each memory die 210a-d (see FIG. 3). When a read CMD signal is issued, the data portions for one or more data sets (e.g., Data1-4) are read and transferred to the TSVs. For example, as discussed above, data portions D1a-d, which correspond to Data1, can be simultaneously read from the respective memory dies 210a-d and transferred to the TSVs A-D during Phase 1. Similarly, data portions D2a-d, D3a-d, and D4a-d can be read during Phases 2-4, respectively, as discussed above.

As discussed above, the read circuit 1000 can be configured to read the data presented on TSV A-D and transfer the data to, for example, the DQ data terminals. For example, as seen in FIG. 10A, the read circuit 1000 can have a plurality of data latch circuits 1010, 1012, 1014, 1016 with each data latch circuit having a plurality of FF circuits corresponding to each bit line of the MIO(T/B) bus (e.g., the MIO(T/B) can be a 128-bit bus or another bit size bus). As discussed below, data latch circuit 1016 can have additional FF circuits that correspond to the output data from data latch circuits 1010,

1012, and 1014. For clarity, the data latch circuits 1010, 1012, 1014, and 1016 are only shown with one FF circuit. However, those skilled in the art will recognize that the number of FF circuits in the data latch circuits will depend on the number of input data lines.

The data input to the data latch circuit 1010 can receive data set Data1 and the clock input to the data latch circuit 1010 can receive a clock signal RD1, which can correspond to the CMD1 signal generated during the Phase 1 period as discussed above. The clock signal RD1 can be in synchronization with the CMD1 signal (in some embodiments being the same signal as CMD1 signal) or the RD1 signal can be delayed based on a read latency in the reading of Data1 from the data segments. Similarly, the data inputs to the data latch circuits 1012 and 1014 can receive data sets Data2 and Data3, respectively. The clock inputs to the data latch circuits 1012 and 1014 can receive clock signals RD2 and RD3, respectively. Similar to the RD1 signal, the RD2 and RD3 signals can respectively correspond to the CMD2 and CMD3 signals generated during the Phase 2 and Phase 3 periods as discussed above. The clock signals RD2 and RD3 can be respectively in synchronization with the CMD2 and CMD3 signals (in some embodiments being the same signal as CMD2 or CMD3 signal as appropriate) or the RD2 and RD3 signals can be delayed based on read latency in the reading from the data segments.

As seen in FIG. 10A, the data input to the data latch circuit 1016 can receive data set Data4 and the outputs of data latch circuits 1010, 1012, and 1014. The clock input to the data latch circuit 1016 can be RD4, which can correspond to the CMD4 signal generated during the Phase 4 period as discussed above. The clock signal RD4 can be in synchronization with the CMD4 signal (e.g., in some embodiments can be the same signal as CMD4 signal) or the RD4 signal can be delayed from the CMD4 signal to take into account read latency in the reading of Data4 from the data segments. In some embodiments, data latch circuit 1016 can be the same as data latch circuits 1010, 1012, and 1014 and a separate data latch circuit can receive the outputs of data latch circuits 1010, 1012, 1014, and 1016.

As discussed above, the phase command signals CMDa-d and the distributed column access signals CASa-d can read the appropriate data set (e.g., Data1-4) and transfer the data set to the TSV connections during each phase (e.g., Phase 1-4) of the CMD signal 510. During each phase (e.g., Phase 1-4) data presented on the TSV connections is timely read by the read circuit 1000 and transferred to the DQ terminals. For example, on the rising edge (or the falling edge) of the RD1 signal, the data latch circuit 1010 can read the data set Data1 values from the TSVs A-D during Phase 1 and output latched values Data1_1 at corresponding to data set Data1. Similarly, on the rising edge (or the falling edge) of RD2, the data latch circuits 1012 can read the data set Data2 values from the TSVs A-D during Phase 2 and output latched values Data2_1 at corresponding to data set Data2. On the rising edge (or the falling edge) of RD3, the data latch circuits 1014 can read the data set Data3 values from the TSVs A-D during Phase 3 and output latched values Data3_1 at corresponding to data set Data3. Finally, on the rising edge (or the falling edge) of RD4, the data latch circuit 1016 can read the Data4 values from the TSVs A-D and the latched data from the outputs of data latch circuits 1010, 1012, 1014 during Phase 4. The output of data latch circuit 1016 is Dout, which corresponds to the values of data sets Data1, Data2, Data3, and Data4. Dout can be transmitted to the DQ data terminals of logic die 230 to be used by, for example, processor component 202 and/or another device.

FIG. 10B illustrates a write circuit 1050 used in transferring data Din to the TSV connections of the MIO(T/B) data bus. Data from DQ data terminations are provided to the input of the write circuit 1050 as data Din. The clock input to the write circuit 1050 can be the WR clock signal. The clock signal WR can be in synchronization with the CMD1 signal and, in some embodiments, can be the same as the CMD1 signal. The write circuit 1050 can be a data latch circuit having a plurality of FF circuits depending on the number of data lines. However, for clarity, the write circuit 1050 only shows one FF circuit. The write circuit 1050 can be part of the read/write circuit 380 in the logic die 230 and connect to the IO circuit 360 of each memory die 210a-d (see FIG. 3).

As discussed above, the phase command signals CMDa-d and the distributed column access signals CASa-d can write the data sets (e.g., Data1-4) made available on the TSV connections to the appropriate data segments (e.g., data segments A-D) in each of the memory dies (e.g., memory dies 210a-d) during each phase (e.g., Phase 1-4) of the CMD signal 510. During each phase (e.g., Phase 1-4) data Din at the DQ terminals can be timely written to the TSVs by the write circuit 1050. For example, on the rising edge (or falling edge) of the WR clock cycle, the write circuit 1050 can read the Din values from the DQ terminals received at the input of the write circuit 1050 during, for example, Phase 1, and output latched values Data1_1at, Data2_1at, Data3_1at, and Data4_1at. In some embodiments, each latched values Data1_1at, Data2_1at, Data3_1at, and Data4_1at can be divided into data portions (e.g., D1a-d, D2a-d, D3a-d, and D4a-d) and multiplexed (not shown) such that the appropriate set of data portions (e.g., D1a-d, D2a-d, D3a-d, and D4a-d) is available for write operations at the TSVs A-D during the appropriate Phase 1-4 of the CMD signal 510. For example, Data1 can be divided into data portions D1a, D1b, D1c, and D1d and made available for write operations at TSVs A-D, respectively, during Phase 1. Similarly, Data 2-4 can be divided and made available for write operations at TSVs A-D during Phases 2-4.

Figure 11:
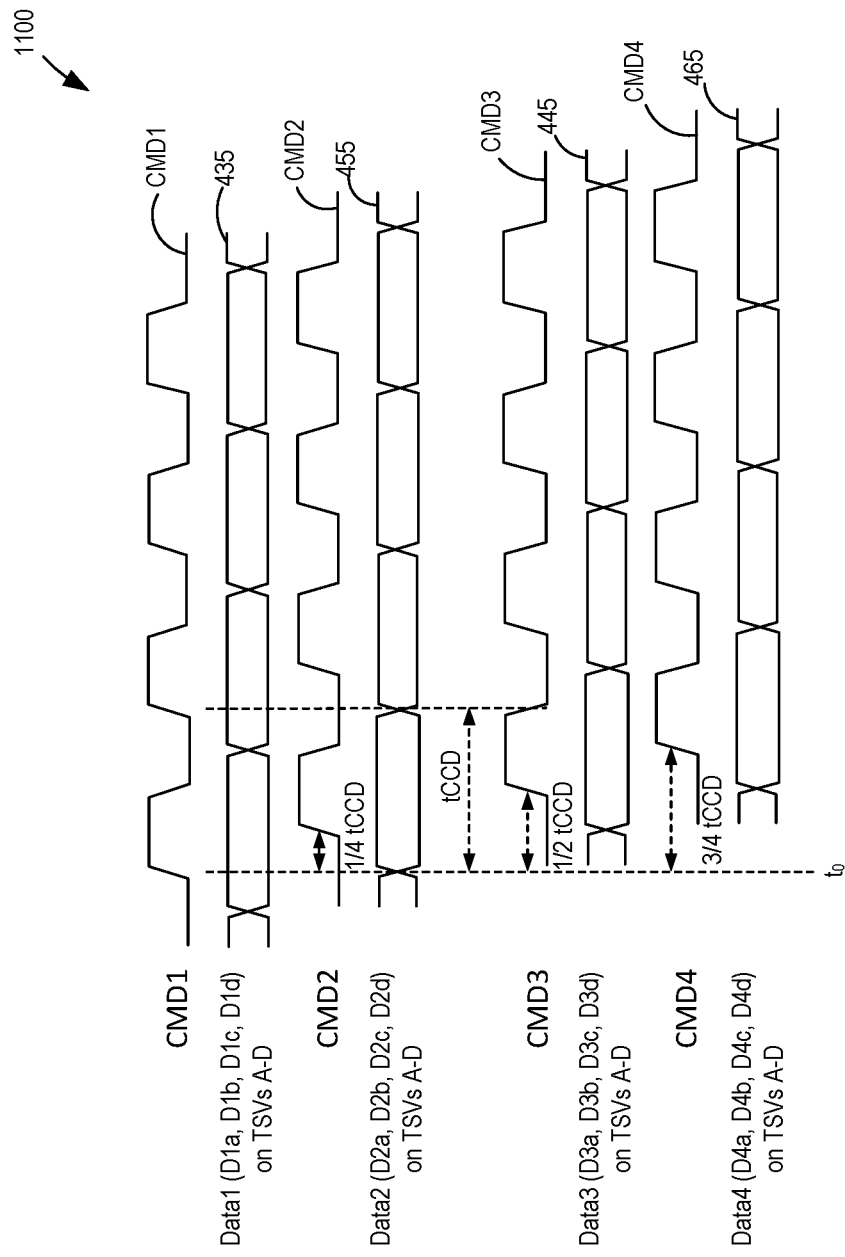
FIG. 11 illustrates a write timing diagram for writing data to the memory component of FIG. 2.

FIG. 11 illustrates an exemplary timing diagram 1100 for a write operation of data sets Data1, Data2, Data3, and Data4 to memory dies 210a-d. As seen in FIG. 11, the data sets are transferred during Phases 1-4 based on the common phase command signals CMD1, CMD2, CMD3, and CMD4 (discussed above). The phase shift between each of the phase command signals in this exemplary embodiment can be 25% of tCCD. For example, the CMD1 signal for Phase 1 can be in phase (e.g., 0% phase shift, e.g., at t=0) with the CMD signal 510 (see FIG. 5), the CMD2 signal for Phase 2 can have a 25% phase shift from the CMD signal (e.g., at t=¼ tCCD), the CMD3 signal for Phase 3 can have a 50% phase shift from the CMD signal (e.g., at t=½ tCCD), and the CMD4 signal for Phase 4 can have a 75% phase shift from the CMD signal (e.g., at t=¾ tCCD). In some embodiments, each CMD1-4 signal can correspond to individual phase command signals CMDa-d and distributed column access select signals CASa-d in the memory dies 210a-d as shown in Tables 2 and 3 and as discussed above. For clarity, the individual phase command signals and the distributed column access signals are not shown in timing diagram 1100.

As seen in timing diagram 1100, on or prior to t0, data set Data1 (data portions D1a, D1b, D1c, D1d) can be made available on TSVs A-D (which can be part of the MIO(T/B) and/or LIO(T/B) buses) for a write operation to the desired memory cells. At time t0 (e.g., Phase 1), the CMD1 signal can be set (e.g., to a high state) to activate the appropriate CSLs as discussed above. For example, with reference to FIG. 4 and Table 1, at t0, CSL 410a in memory die 210a can be activated, CSL 410d in memory die 210b can be activated, CSL 410b in memory die 210c can be activated, and CSL 410c in memory die 210d can be activated. As discussed above, activating CSLs provides access to the desired memory cell in the appropriate data segment A-D and the value of the appropriate data portion D1a, D1b, D1c, D1d on the TSV A-D connection can be written to the data segments A-D. For example, with reference to FIG. 8A and Table 1, during Phase 1, D1a can be written to data segment A of memory die 210a, D1b can be written to data segment B of memory die 210c, D1c can be written to data segment C of memory die 210d, and D1d can be written to data segment D of die 210b.

On or prior to t1 (e.g., Phase 2), data set Data2 (data portions D2a, D2b, D2c, D2d) can be made available on TSVs A-D for a write operation to the desired memory cell. At time t1, the CMD2 signal can be set (e.g., to a high state) to activate the appropriate CSLs as discussed above. For example, with reference to FIG. 4 and Table 1, at t1 CSL 410c in memory die 210a can be activated, CSL 410a in memory die 210b can be activated, CSL 410d in memory die 210c can be activated, and CSL 410b in memory die 210d can be activated. With reference to FIG. 8A and Table 1, during Phase 2, D2a can be written to data segment A of memory die 210b, D2b can be written to data segment B of memory die 210d, D2c can be written to data segment C of memory die 210a, and D2d can be written to data segment D of memory die 210d.

On or prior to t2 (e.g., Phase 3), data set Data3 (data portions D3a, D3b, D3c, D3d) can be made available on TSVs A-D for a write operation to the desired memory cell. At time t2, the CMD3 signal can be set (e.g., to a high state) to activate the appropriate CSLs as discussed above. For example, with reference to FIG. 4 and Table 1, at t2, CSL 410b in memory die 210a can be activated, CSL 410c in memory die 210b can be activated, CSL 410a in memory die 210c can be activated, and CSL 410d in memory die 210d can be activated. With reference to FIG. 8A and Table 1, during Phase 3, D3a can be written to data segment A of memory die 210c, D3b can be written to data segment B of memory die 210a, D3c can be written to data segment C of memory die 210b, and D3d can be written to data segment D of memory die 210d.

On or prior to t3 (e.g., Phase 4), Data4 (data portions D4a, D4b, D4c, D4d) can be made available on TSVs A-D for a write operation to the desired memory cell. At time $t_3$, the CMD4 signal can be set (e.g., to a high state) to activate the appropriate CSLs as discussed above. For example, with reference to FIG. 4 and Table 1, at t3, CSL 410d in memory die 210a can be activated, CSL 410b in memory die 210b can be activated, CSL 410c in memory die 210c can be activated, and CSL 410a in memory die 210d can be activated. With reference to FIG. 8A and Table 1, during Phase 4, D4a can be written to data segment A of memory die 210d, D4b can be written to data segment B of memory die 210b, D4c can be written to data segment C of memory die 210c, and D4d can be written to data segment D of memory die 210a.

At time tCCD, the process repeats until all desired data is written to the appropriate memory cells. For brevity, the read timing diagram is not shown, but those skilled in the art understand that the timing will be similar but with the data being read from the memory cells and being transferred to the appropriate TSV A-D connections. As seen in timing diagram 1100, for each period tCCD, four data transfers are performed as compared to one data transfer in related art memory devices. Thus, exemplary embodiments of the present invention can achieve a higher throughput (e.g., four times the throughput) as related art memory devices. In addition, as compared to related art systems, the amp modules do not require a higher voltage to limit IR voltage drop and the noise on the power bus is decreased.

Although the present invention has been described with reference to the disclosed embodiments, persons skilled in the art will recognize that changes may be made in form and detail without departing from the invention. That is, the above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, the various embodiments described herein may be combined to provide further embodiments. Such modifications are well within the skill of those ordinarily skilled in the art. Accordingly, the invention is not limited except as by the appended claims.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The processing device (e.g., processor 116 and/or another processor/controller) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., processor component 204 and/or another controller) can also be one or more special-purpose processing devices such as an application specific integrated circuit (ASIC), system-on-a-chip, a field programmable gate array (FPGA), a digital signal processor (DSP), network processor, or the like. The processing device (e.g., processor component 204 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory component 202 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and/or symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. An apparatus, comprising:
   a plurality of memory dies, each memory die having,
   at least one memory cell array divided into a plurality of data segments that are configured to be selectively accessed, and
   a stagger circuit configured to select a common command signal from a plurality of common command signals and configured to set at least one of a column access signal or an individual command signal, the column access signal to select a data segment to be accessed based on the common command signal and the individual command signal to perform a memory operation corresponding to the selected common command signal on the selected data segment;
   a data bus connecting each of the at least one memory cell arrays to form a plurality of data units, each data unit including a data segment from each memory cell array, wherein the data segments in each data unit are connected in parallel to the data bus and use a same line of the data bus; and
   a command signal circuit connected to each stagger circuit in the plurality of memory dies and configured to generate the plurality of common command signals, wherein the stagger circuits are further configured such that the selected data segments are not part of a same data unit.

2. The apparatus of claim 1, further comprising an input-output circuit to simultaneously transfer data to or from the selected data segments.

3. The apparatus of claim 1, wherein the command signal circuit receives a main command signal and generates the plurality of common command signals based on the main command signal, each common command signal set at a different phase of the main command signal, and
   wherein a different data segment in each of the plurality of memory dies is selected for each phase of the main command signal.

4. The apparatus of claim 1, wherein each stagger circuit includes a plurality of selector circuits respectively corresponding to the plurality of data segments, each selector circuit having a plurality of input connections to respectively receive one of the plurality of common command signals and an output to select the corresponding data segment for access, wherein each selector circuit is configured to select a signal received at a predetermined input connection, and wherein an order of the plurality of common command signals for the input connections at each of the selector circuits in the stagger circuit is different.

5. The apparatus of claim 4, wherein the common command signal order at the selector circuits of each of the stagger circuits is same between memory dies.

6. The apparatus of claim 4, wherein the predetermined input connection is designated for each selector circuit based on a program code, and wherein the predetermined input connection is same for each selector circuit in a stagger circuit.

7. The apparatus of claim 6, wherein the predetermined input connection is different between stagger circuits.

8. The apparatus of claim 3, wherein each memory die further includes a plurality of amplifier (amp) modules corresponding to the plurality of data segments, each amp module having a write driver, a read amplifier, or both, and wherein each stagger circuit is configured to select data segments whose amp modules are not disposed adjacent to each other on a power bus between consecutive phases of the main command signal.

9. The apparatus of claim 3, wherein a data set to be transferred is split into data portions and each data portion of the data set is stored in a separate memory die, and wherein the data portions of the data set are transferred simultaneously during a single phase of the main command signal.

10. The apparatus of claim 1, wherein each memory die is configured such that each data segment of the plurality of data segments has a corresponding column select line, and wherein selecting the data segment to be accessed includes activating the corresponding column select line using the column access signal.

11. The apparatus of claim 1, wherein the column access signal and the individual command signal are generated at a same time.

12. The apparatus of claim 3, wherein the main command signal corresponds to one of a read request or a write request that is generated external to the apparatus.

13. The apparatus of claim 3, wherein a number of the common command signals generated by the command signal circuit is equal in number to the data segments.

14. The apparatus of claim 11, wherein the number of data segments is in a range of 2 to 8.

15. The apparatus of claim 1, wherein the stagger circuit is configured to output the column access signal and the individual command signal.

16. The apparatus of claim 1, wherein the plurality of memory dies are arranged in a stacked configuration.

17. The apparatus of claim 16, wherein the apparatus is one of a high bandwidth memory device or a wide I/O memory device having a stacked arrangement of the plurality of memory dies.

18. An apparatus, comprising:
a first memory die including a first memory cell array divided, at least in part, into a first data segment and a second data segment;
a second memory die stacked with the first memory die, the second memory die including a second memory cell array divided, at least in part, into a third data segment and a fourth data segment;
a first data bus coupled in common to the first data segment of the first memory die and the third data segment of the second memory die; and
a second data bus coupled in common to the second data segment of the first memory die and the fourth data segment of the second memory die;
wherein the first memory die is configured to simultaneously transfer memory data from the first data segment to the first data bus when the second memory die transfers memory data from the fourth data segment to the second data bus, and
wherein the first data bus is separate and distinct from the second data bus, the first data segment is separate from the second data segment, and the third data segment is separate from the fourth data segment.

19. The apparatus of claim 18, wherein the second memory die is configured to transfer memory data from the third data segment to the first data bus when the first memory die is configured to transfer memory data from the second data segment to the second data bus.

20. The apparatus of claim 19, wherein the first and second memory dies are configured such that the transfer of the memory data from the second data segment is done after the transfer of the memory data from the first data segment.

21. The apparatus of claim 20, wherein the first and second memory dies are configured such that the transfers from the first and second data segments are performed at different phases of a single command signal period.

22. The apparatus of claim 18, wherein the first memory die includes first amplifier (amp) module corresponding to the first data segment disposed on a power bus and a second amp module corresponding to the second data segment disposed on the power bus, and wherein the first amp module is not disposed adjacent the second amp module on the power bus.

23. The apparatus of claim 18, wherein the apparatus is one of a high bandwidth memory device or a wide I/O memory device having a stacked arrangement of the first and second memory dies.

* * * * *